(12) United States Patent
Ichiyanagi et al.

(10) Patent No.: US 8,369,064 B2
(45) Date of Patent: Feb. 5, 2013

(54) CERAMIC CAPACITOR AND WIRING BOARD

(75) Inventors: Seiji Ichiyanagi, Kitanagoya (JP); Kenji Murakami, Kani (JP); Motohiko Sato, Konan (JP); Jun Otsuka, Konan (JP); Masahiko Okuyama, Nagoya (JP)

(73) Assignee: NGK Spark Plug Co., Ltd., Nagoya (JP)

( * ) Notice: Subject to any disclaimer, the term of this patent is extended or adjusted under 35 U.S.C. 154(b) by 318 days.

(21) Appl. No.: 12/791,303

(22) Filed: Jun. 1, 2010

(65) Prior Publication Data
US 2010/0300740 A1 Dec. 2, 2010

(30) Foreign Application Priority Data
Jun. 1, 2009 (JP) ................. 2009-132289

(51) Int. Cl.
H01G 4/06 (2006.01)
H01G 4/005 (2006.01)
(52) U.S. Cl. ..................... 361/311; 361/303
(58) Field of Classification Search .......... 361/303, 361/311
See application file for complete search history.

(56) References Cited

U.S. PATENT DOCUMENTS
2005/0207091 A1  9/2005  Kambe et al.
2007/0045814 A1* 3/2007  Yamamoto et al. ........... 257/698
2009/0255719 A1  10/2009 Yamamoto et al.

FOREIGN PATENT DOCUMENTS
JP  2005-39243 A  2/2005
JP  2007-96262 A  4/2007
JP  2008-021980 A  1/2008

OTHER PUBLICATIONS

Commonly owned, Co-Pending U.S. Appl. No. 12/791,332, filed Jun. 1, 2010; Inventors: Seiji Ichiyanagi, Kenji Murakami, Motohiko Sato, Jun Otsuka, and Masahiko Okuyama (Stored in IFW).

* cited by examiner

*Primary Examiner* — Eric Thomas
(74) *Attorney, Agent, or Firm* — Stites & Harbison PLLC; Jeffrey A. Haeberlin; Nicolo Davidson

(57) ABSTRACT

A ceramic capacitor includes a capacitor body and a metal layer arranged on an outer surface of the capacitor body. The outer surface includes: a first capacitor major surface; a second capacitor major surface opposite to the first capacitor major surface in a thickness direction of the capacitor body; and a capacitor lateral surface between the first and second capacitor major surfaces. The capacitor body includes a first layer section and a second layer section. The first layer section includes a plurality of ceramic dielectric layers and a plurality of internal electrodes, wherein the ceramic dielectric layers and the internal electrodes are layered alternately. The second layer section is exposed at the first capacitor major surface, and includes a corner portion at a boundary between the first capacitor major surface and the capacitor lateral surface. The metal layer covers the corner portion of the second layer section.

31 Claims, 13 Drawing Sheets

CERAMIC CAPACITOR AND WIRING BOARD

BACKGROUND OF THE INVENTION

The present invention relates to a ceramic capacitor adapted to be mounted inside a wiring board or on a surface of a wiring board, and relates to such a wiring board.

In recent years, the speed and function of semiconductor integrated circuit chips (IC chips) which are used as a microprocessor in a computer, etc., are increasingly enhanced. Accordingly, a typical IC chip tends to have an increasing number of terminals, and a decreasing pitch between the terminals. Such a typical IC chip has a bottom surface on which a lot of dense terminals are arranged in an array, where the terminals are connected to terminals of a mother board by flip chip mounting. It is however generally difficult to directly connect such an IC chip to a mother board, because IC chip terminals are significantly different from mother board terminals in inter-terminal pitch. Accordingly, such connection is usually implemented by preparing a package where an IC chip is mounted on an IC-chip-mounting wiring board, and mounting the package on a mother board. For such an IC-chip-mounting wiring board, provision of a capacitor is proposed for reduction of switching noise of an IC chip, and stabilization of a supply voltage. For example, Japanese Patent Application Publication No. 2005-39243 shows in FIG. 4 a wiring board in which a ceramic capacitor is mounted in an accommodation hole formed in a core board made of a high polymer material, and the front side and back side of the core board are formed with buildup layers. Japanese Patent Application Publication No. 2007-96262 shows in FIG. 1 a similar wiring board.

FIG. 14 schematically shows a ceramic capacitor 201 according to a reference example. The ceramic capacitor 201 includes a capacitor-forming layer section 202 and a cover layer section 203. The capacitor-forming layer section 202 has a structure in which first internal electrodes 206 and second internal electrodes 207 are arranged alternately, wherein each first internal electrode 206 and one of the second internal electrodes 207 adjacent to the first internal electrode 206 sandwich a ceramic dielectric layer 205 therebetween. Each ceramic dielectric layer 205 is a sintered product of barium titanate as high dielectric constant ceramics, serving as a dielectric or insulator between the first internal electrode 206 and second internal electrode 207.

The cover layer section 203 includes a plurality of ceramic dielectric layers 209 which are layered together. The cover layer section 203 is arranged at an outer surface of the ceramic capacitor 201, covering the capacitor-forming layer section 202. The cover layer section 203 serves for electrical insulation, heat resistance, and moisture resistance of the ceramic capacitor 201.

The ceramic capacitor 201 is formed with a lot of via holes 210 which are arranged in an array spreading all over the ceramic capacitor 201. Each via hole 210 extends through between capacitor major surfaces 213 of the ceramic capacitor 201. In each via hole 210 is provided a first via conductor 211 or second via conductor 212. Each first via conductor 211 extends through the first internal electrodes 206, and electrically connects the same together. Each second via conductor 212 extends through the second internal electrode 207, and electrically connects the same together.

Each capacitor major surface 213 of the ceramic capacitor 201 is provided with first external electrodes 215 and a second external electrode 216 which are placed on the capacitor major surface 213. Each first external electrode 215 is connected directly to an end surface of a corresponding one of the first via conductors 211. The second external electrode 216 is connected directly to end surfaces of the second via conductors 212. The second external electrode 216 is a plane conductor that covers the substantially entire capacitor major surface 213, and includes a plurality of holes such that the second surface electrode 216 is out of contact with the first external electrodes 215. Each first external electrode 215 is a circular conductor that is arranged on the capacitor major surface 213.

When the ceramic capacitor 201 shown in FIG. 14 is mounted inside a wiring board as disclosed in Japanese Patent Application Publication No. 2005-39243, the outer surface of the ceramic capacitor 201 is subject to an external stress due to hardening and shrinkage of a resin and/or due to a history of heating (difference in thermal expansion). The external stress is likely to be concentrated at corner portions 200 each of which is located at a boundary between a capacitor lateral surface 214 and one of the capacitor major surfaces 213. If the ceramic dielectric layers 205 or 209, which are brittle in general, are exposed near the corner portions 200 under a buildup layer 250, it is likely that a crack 221 occurs in the ceramic dielectric layers 205 or 209 near the corner portion 200, and runs in the direction of an arrow F1 as shown in FIG. 15. This can adversely affect the reliability of the wiring board.

In order to prevent the occurrence and development of such a crack 221, it is proposed to layer a dummy electrode 217 between the ceramic dielectric layers 209 for enhancing the toughness of the cover layer section 203, as shown in FIG. 16.

SUMMARY OF THE INVENTION

The dummy electrode 217 shown in FIG. 16 serves to prevent the development of such a crack 221 into the capacitor-forming layer section 202, because the dummy electrode 217 extends in the horizontal direction of the cover layer section 203. However, it is still difficult to completely prevent the occurrence of such a crack 221. Accordingly, the provision of the dummy electrode 217 cannot completely prevent the reliability of the wiring board from falling.

In view of the foregoing, it is preferable to provide a ceramic capacitor adapted to be mounted inside a wiring board or on a surface of a wiring board, in which cracks are prevented, which may occur, for example, when the ceramic capacitor is mounted inside the wiring board, and to provide such a wiring board.

According to one aspect of the present invention, a ceramic capacitor comprises: a capacitor body including an outer surface, wherein the outer surface includes: a first capacitor major surface; a second capacitor major surface opposite to the first capacitor major surface in a thickness direction of the capacitor body; and a capacitor lateral surface between the first capacitor major surface and the second capacitor major surface; and a metal layer arranged on the outer surface of the capacitor body, wherein: the capacitor body includes a first layer section and a second layer section; the first layer section includes a plurality of ceramic dielectric layers and a plurality of internal electrodes, wherein the ceramic dielectric layers and the internal electrodes are layered alternately; the second layer section is exposed at the first capacitor major surface, and includes a corner portion at a boundary between the first capacitor major surface and the capacitor lateral surface; and the metal layer covers the corner portion of the second layer section.

According to another aspect of the present invention, a wiring board comprises a portion inside which the ceramic capacitor is mounted.

According to a further aspect of the present invention, a wiring board comprises a board major surface on which the ceramic capacitor is mounted by flip chip mounting.

DETAILED DESCRIPTION OF THE INVENTION

Figure 1:
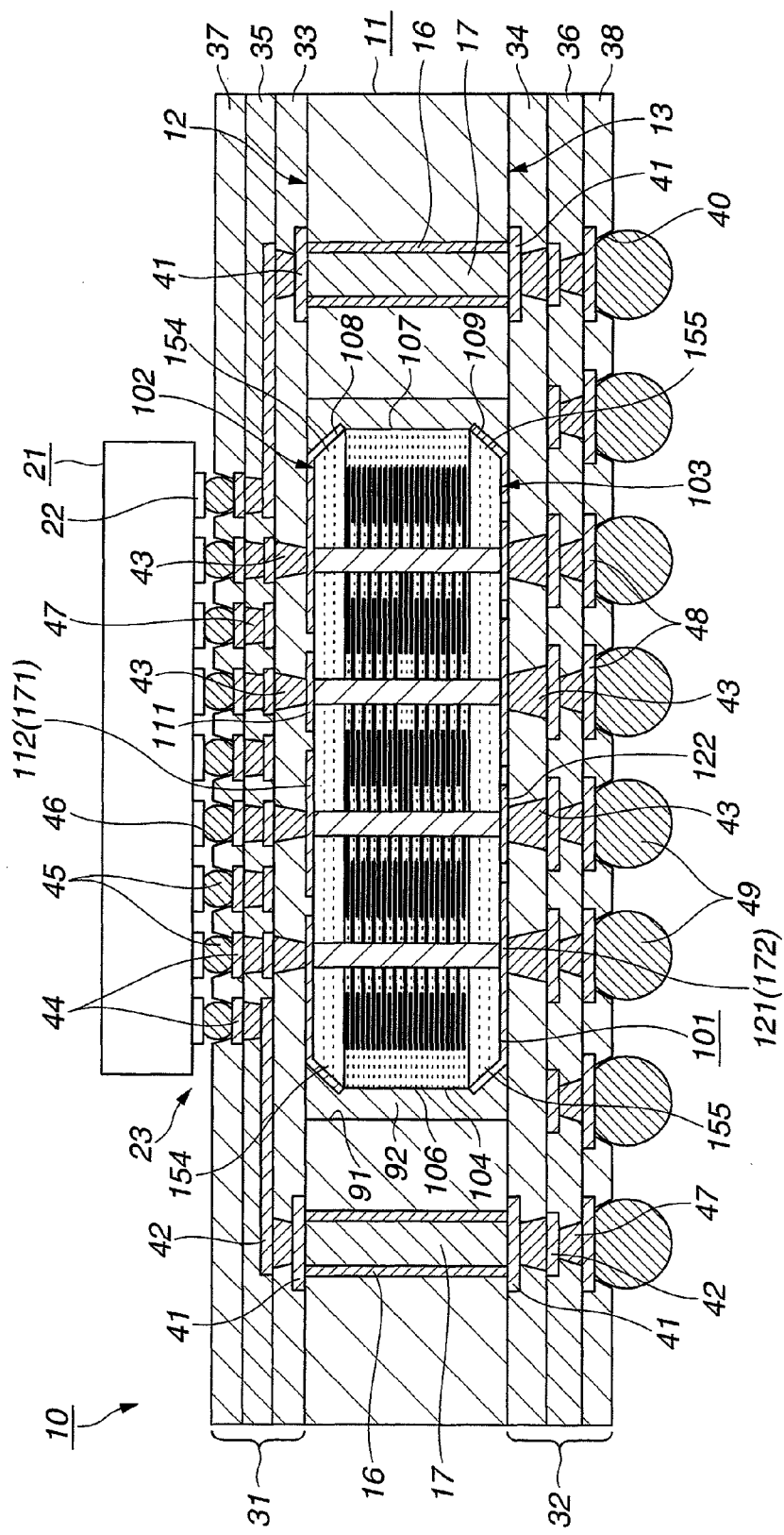
FIG. 1 is a schematic sectional view of a wiring board according to a first embodiment of the present invention.

<First Embodiment> FIG. 1 schematically shows a wiring board 10 according to a first embodiment of the present invention. The wiring board 10 is adapted to be used to mount an IC chip. As shown in FIG. 1, the wiring board 10 includes a substantially rectangular core board 11, a major surface side buildup layer (major surface side wiring layer section) 31, and a back surface side buildup layer (back surface side wiring layer section) 32. The major surface side buildup layer 31 is formed on a core major surface 12 of the core board 11. The back surface side buildup layer 32 is formed on a core back surface 13 of the core board 11.

The core board 11 has the form of a substantially rectangular plate as viewed in a plan view, which has a longitudinal length of 25 mm, a lateral length of 25 mm, and a thickness of 1.0 mm. The core board 11 has a thermal expansion coefficient of about 10 to 30 ppm/° C. (specifically, 18 ppm/° C., in this example) in horizontal directions (XY directions). The thermal expansion coefficient indicates an average of measured values between 0° C. and a glass transition temperature (Tg). The core board 11 includes a plurality of portions each of which is formed with a through hole conductor 16. The through hole conductor 16 is electrically connected between the side of the core major surface 12 and the side of the core back surface 13. The internal space of the through hole conductor 16 is blocked by a blocker 17 that is made of epoxy resin in this example. Each of the core major surfaces 12 and 13 of the core board 11 is formed with a conductor layer 41. The conductor layer 41 is made of a pattern of copper, and electrically connected to the through hole conductors 16.

As shown in FIG. 1, the major surface side buildup layer 31 includes two resin interlayer insulation layers 33 and 35, and a conductor layer 42, which are layered together, wherein the conductor layer 42 is sandwiched between the resin interlayer insulation layers 33 and 35. Each resin interlayer insulation layer 33 or 35 is made of a thermosetting resin such as an epoxy resin. The conductor layer 42 is made of copper. Each resin interlayer insulation layer 33 or 35 has a thermal expansion coefficient of about 10 to 60 ppm/° C. (specifically, about 30 ppm/° C., in this example) in horizontal directions (XY directions). The thermal expansion coefficient indicates an average of measured values between 0° C. and a glass transition temperature (Tg). One surface of the second resin interlayer insulation layer 35 includes portions each of which is provided with a terminal pad 44. The terminal pads 44 are arranged in an array. The surface of the resin interlayer insulation layer 35 is almost entirely covered by a solder resist 37. The solder resist 37 includes portions each of which is formed with an opening 46 through which a corresponding one of the terminal pads 44 is exposed. On the surface of each terminal pad 44 is arranged a solder bump 45. Each solder bump 45 is electrically connected to a corresponding surface connection terminal 22 of an IC chip 21 that has the form of a flat plate. The space where the terminal pads 44 and solder bumps 45 are arranged serves as an IC-chip-mounting space 23 adapted to mount the IC chip 21. The IC-chip-mounting space 23 is thus provided on the outer surface of the major surface side buildup layer 31. The resin interlayer insulation layers 33 and 35 are provided with a set of via conductors 43 and a set of via conductors 47, respectively. The via conductors 43 and 47 electrically connect the conductor layer 42 and terminal pads 44 to one another.

As shown in FIG. 1, the back surface side buildup layer 32 is constructed generally in the same way as the major surface side buildup layer 31. Specifically, the back surface side buildup layer 32 includes two resin interlayer insulation layers 34 and 36, and a conductor layer 42, which are layered together, wherein the conductor layer 42 is sandwiched between the resin interlayer insulation layers 34 and 36. Each resin interlayer insulation layer 34 or 36 is made of a thermosetting resin such as an epoxy resin. Each resin interlayer insulation layer 34 or 36 has a thermal expansion coefficient of about 10 to 60 ppm/° C. (specifically, about 30 ppm/° C., in this example) in horizontal directions (XY directions). A lower surface of the second resin interlayer insulation layer 36 includes portions each of which is provided with a BGA pad 48 that is electrically connected to a conductor layer 42 through a via conductor 47. The BGA pads 48 are arranged in an array. The lower surface of the resin interlayer insulation layer 36 is almost entirely covered by a solder resist 38. The solder resist 38 includes portions each of which is formed with an opening 40 through which a corresponding one of the BGA pads 48 is exposed. On the surface of each BGA pad 48 is disposed a solder bump 49 that is adapted to be connected to a mother board not shown. Each solder bump 49 serves to mount the wiring board 10 on the mother board.

As shown in FIG. 1, the core board 11 is formed with an accommodation hole 91 that is a through hole extending through the core board 11, and opens at the center of the core major surface 12, and at the center of the core back surface 13. The accommodation hole 91 has the form of a rectangle as viewed in a plan view. The accommodation hole 91 accommodates a ceramic capacitor 101. The ceramic capacitor 101 is mounted under a condition that a first capacitor major surface 102 of the ceramic capacitor 101 faces and contacts the back surface side buildup layer 32, similar to the core major surface 12 of the core board 11. The ceramic capacitor 101 has the form of a flat rectangular plate having a longitudinal length of 15.0 mm, a lateral length of 15.0 mm, and a thickness of 0.8 mm.

The space between the inside periphery of the accommodation hole 91 and capacitor lateral surfaces 106 of the ceramic capacitor 101 is filled with a filler 92 that is a resin insulator material (thermosetting resin, in this example). The filler 92 serves to fix the ceramic capacitor 101 to the core board 11, and absorb deformation of the ceramic capacitor 101 and core board 11 in the thickness direction and in the horizontal directions by elastic deformation of the filler 92. Namely, the ceramic capacitor 101 is mounted in the wiring board 10 under condition that the outer surface of the ceramic capacitor 101 is in contact with the filler 92. The filler 92 has a thermal expansion coefficient of about 10 to 60 ppm/° C. (specifically, about 20 ppm/° C., in this example) under condition that the filler 92 is completely hardened. The thermal expansion coefficient indicates an average of measured values between 30° C. and a glass transition temperature (Tg) under condition that the filler 92 is completely hardened.

As shown in FIG. 1, the ceramic capacitor 101 is located just below the IC-chip-mounting space 23. The area of the IC-chip-mounting space 23 (the area of the portion of the IC chip 21 where the surface connection terminals 22 are formed) is set smaller than the area of the first capacitor major surface 102 of the ceramic capacitor 101. As viewed in the thickness direction of the ceramic capacitor 101, the IC-chip-mounting space 23 is located within the first capacitor major surface 102 of the ceramic capacitor 101.

Figure 2:
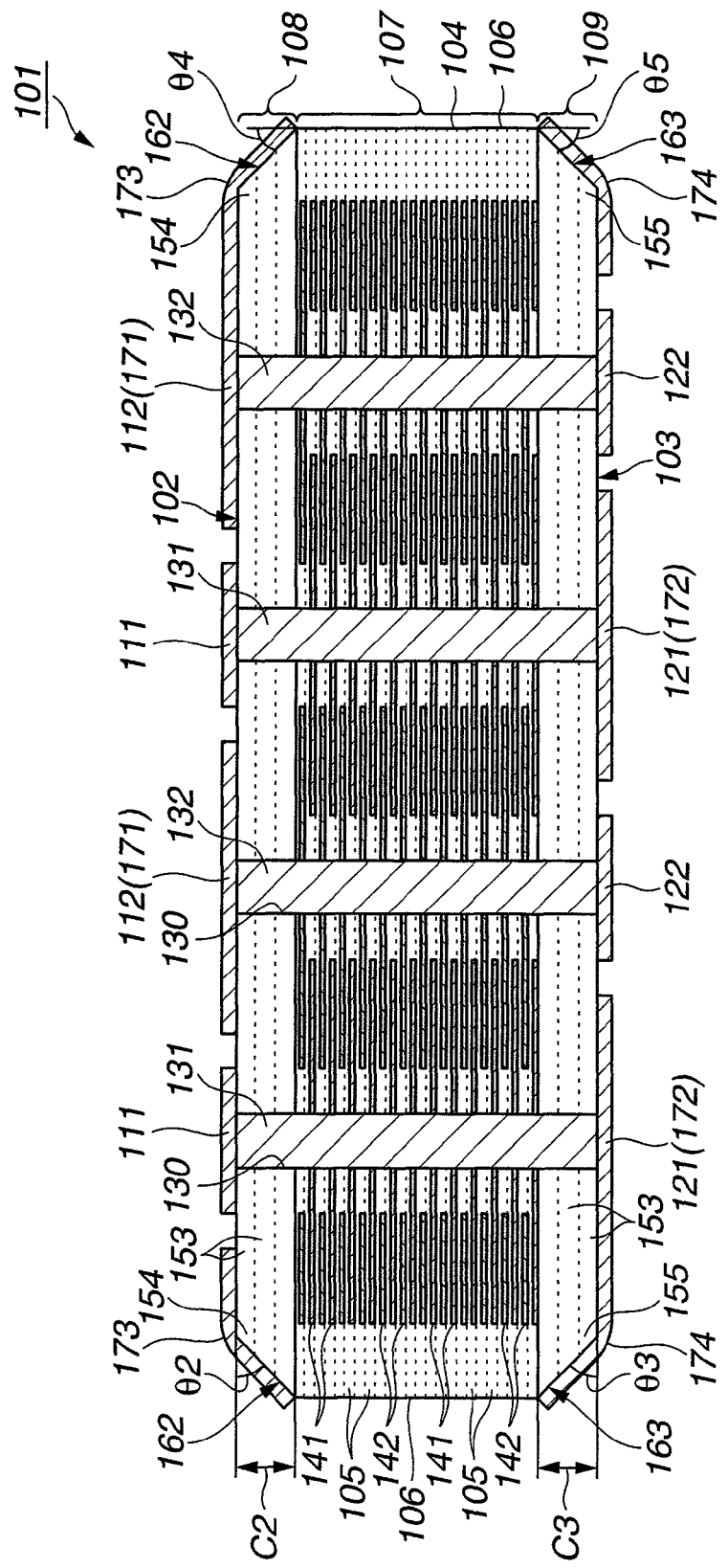
FIG. 2 is a schematic sectional view of a ceramic capacitor according to the first embodiment.

As shown in FIGS. 1 and 2, the ceramic capacitor 101 is of a so-called via array type. The ceramic capacitor 101 is constituted by a ceramic sintered product (capacitor body) 104 that has the form of a substantially rectangular plate having a first capacitor major surface 102 (upper surface in FIG. 1), a second capacitor major surface 103 (lower surface in FIG. 1), and four capacitor lateral surfaces 106. The first capacitor major surface 102 and second capacitor major surface 103 are located opposite to one another in the thickness direction of the ceramic sintered product 104. The ceramic sintered product 104 has a thermal expansion coefficient below 15 ppm/° C. (specifically, about 12 to 13 ppm/° C., in this example). The thermal expansion coefficient is an average of measured values between 30° C. and 250° C.

The ceramic sintered product 104 includes a capacitor-forming layer section (first layer section) 107, a cover layer section (second layer section) 108, and a cover layer section (second layer section) 109. The cover layer section 108 covers the upper surface of the capacitor-forming layer section 107. The cover layer section 109 covers the lower surface of the capacitor-forming layer section 107. The capacitor-forming layer section 107 has a structure where a plurality of ceramic dielectric layers 105 and a plurality of internal electrodes 141 and 142 are layered alternately. The internal electrodes include power-side internal electrodes 141 and ground-side internal electrodes 142 which are layered alternately, wherein each power-side internal electrode 141 and ground-side internal electrode 142 adjacent to the power-side internal electrode 141 sandwiches one of the ceramic dielectric layers 105. Each ceramic dielectric layer 105 is made of a sintered product of barium titanate as a high dielectric constant ceramics, serving as a dielectric member (insulator) between the power-side internal electrode 141 and ground-side internal electrode 142. Each internal electrode 141, 142 is a conductor containing nickel as a main component, and has a thickness of about 2 µm, in this example.

Figure 5:
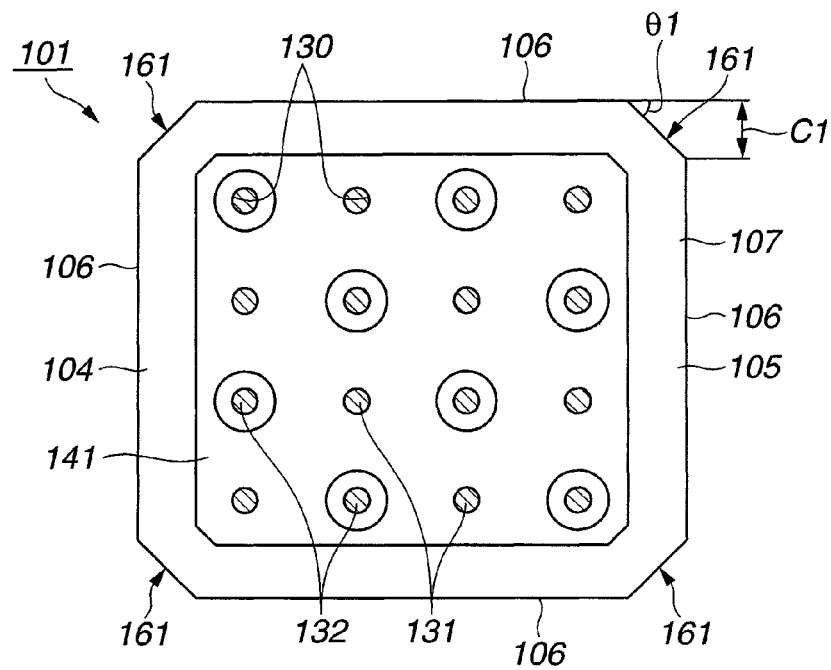
FIG. 5 is a schematic view showing how a power-side internal electrode is connected to power-side in-capacitor via conductors in a capacitor-forming layer section of the ceramic capacitor according to the first embodiment.
Figure 6:
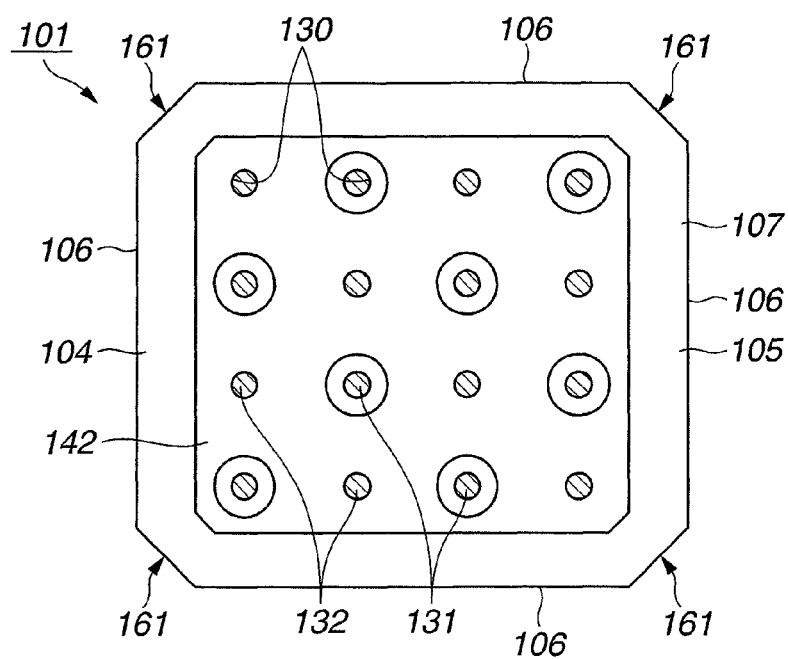
FIG. 6 is a schematic view showing how a ground-side internal electrode is connected to ground-side in-capacitor via conductors in the capacitor-forming layer section according to the first embodiment.
Figure 7:
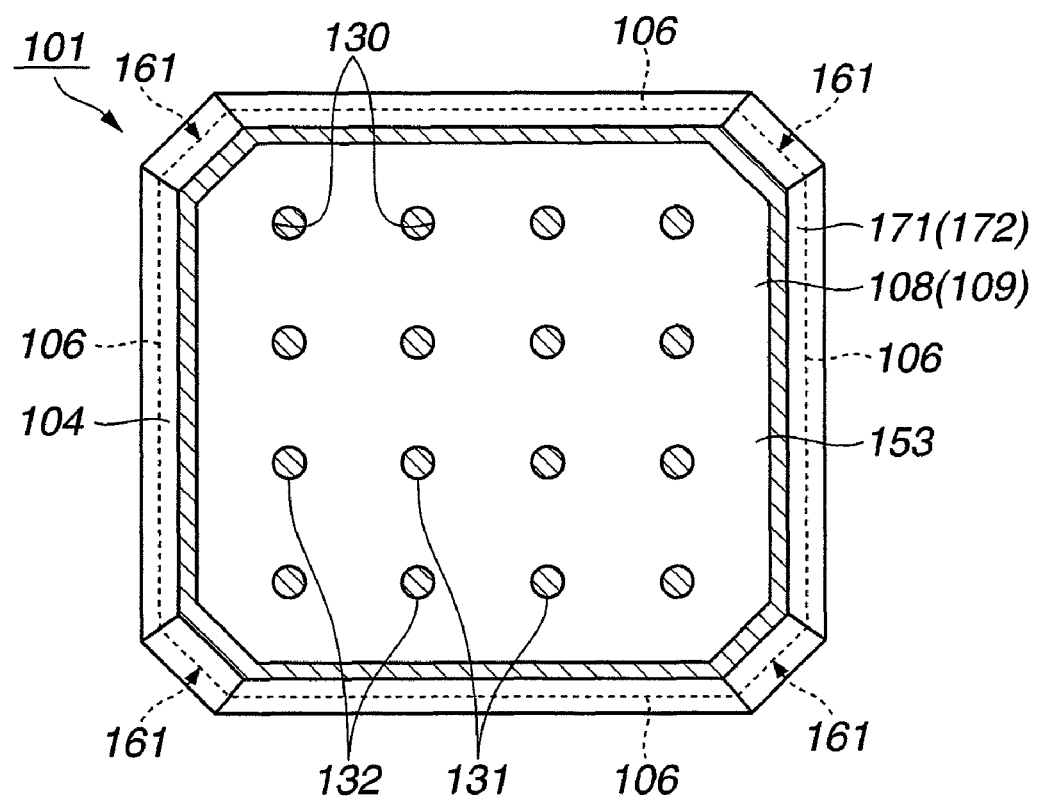
FIG. 7 is a schematic plan view of a cover layer section of the ceramic capacitor according to the first embodiment.

As shown in FIGS. 5 to 7, the ceramic sintered product 104 is formed with a lot of via holes 130. The via holes 130 are arranged in an array in the entire ceramic sintered product 104. Each via hole 130 extends through the ceramic sintered product 104 in the thickness direction of the ceramic sintered product 104. The number of the via holes 130 is greater than 4×4, although 4×4 via holes 130 are shown in the figures for ease of understanding. Each via hole 130 is provided with a power-side in-capacitor via conductor 131 or ground-side in-capacitor via conductor 132 that connects the first capacitor major surface 102 and second capacitor major surface 103 of the ceramic sintered product 104 to one another. The power-side in-capacitor via conductor 131 or ground-side in-capacitor via conductor 132 contains nickel as a main component. Each power-side in-capacitor via conductor 131 extends through the power-side internal electrodes 141, and electrically connects the same to one another, as shown in FIGS. 2 and 5. Each ground-side in-capacitor via conductor 132 extends through the ground-side internal electrodes 142, and electrically connects the same to one another, as shown in FIGS. 2 and 6.

As shown in FIGS. 1 and 2, the cover layer sections 108 and 109 of the ceramic sintered product 104 are exposed at the outer surfaces of the ceramic sintered product 104. Specifically, the cover layer section 108 is exposed at the first capacitor major surface 102, whereas the cover layer section 109 is exposed at the second capacitor major surface 103. Each cover layer section 108 or 109 has a structure where a plurality of ceramic dielectric layers 153 are layered together. Each ceramic dielectric layer 153 is made of a sintered product of barium titanate in the same manner as the ceramic dielectric layers 105 of the capacitor-forming layer section 107, and formed thicker than the ceramic dielectric layers 105. This feature is effective for providing sufficient insulation, anti-humidity, etc., of the ceramic capacitor 101.

As shown in FIGS. 3 to 7, the ceramic sintered product 104 is formed with lateral chamfers 161 at four corners (boundaries between two adjacent capacitor lateral surfaces 106). Each lateral chamfer 161 is formed flat. Each lateral chamfer 161 has a chamfer depth C1 that is above 0.55 mm (0.6 mm, in this example), with respect to one of the corresponding two adjacent capacitor lateral surfaces 106, as shown in FIG. 5. Each lateral chamfer 161 has a chamfer angle θ1 of 45° with respect to one of the corresponding capacitor lateral surfaces 106, as shown in FIG. 5. Accordingly, the angle between each lateral chamfer 161 and one of the corresponding capacitor lateral surfaces 106 is equal to an obtuse angle of 135° (=180°−θ1).

As shown in FIG. 2, the cover layer section 108 includes a corner portion 154 at a boundary between the first capacitor major surface 102 and a set of the capacitor lateral surfaces 106 and lateral chamfers 161. The corner portion 154 is formed with flat chamfers 162. Similarly, the cover layer section 109 includes a corner portion 155 at a boundary between the second capacitor major surface 103 and a set of the capacitor lateral surfaces 106 and lateral chamfers 161. The corner portion 155 is formed with flat chamfers 163.

Each chamfer 162 has a chamfer depth C2 that is equal to 0.1 mm, with respect to the first capacitor major surface 102. Each chamfer 163 has a chamfer depth C3 that is equal to 0.1 mm, with respect to the second capacitor major surface 103. Namely, the chamfer depths C2 and C3 are smaller than half of the thickness of the ceramic sintered product 104 that is equal to 0.8 mm in this example, and are smaller than the chamfer depth C1 that is equal to 0.6 mm.

As shown in FIG. 2, each lateral chamfer 162 has a chamfer angle θ2 of 45° with respect to the first capacitor major surface 102, and each lateral chamfer 163 has a chamfer angle θ3 of 45° with respect to the second capacitor major surface 103. Accordingly, the angle between each lateral chamfer 162 and the first capacitor major surface 102 is equal to an obtuse angle of 135° (=180°−θ2), and the angle between each lateral chamfer 163 and the second capacitor major surface 103 is equal to an obtuse angle of 135° (=180°−θ3). Moreover, each lateral chamfer 162 has a chamfer angle ƒ4 of 45° with respect to the capacitor lateral surface 106, and each lateral chamfer 163 has a chamfer angle θ5 of 45° with respect to the capacitor lateral surface 106. Accordingly, the angle between each lateral chamfer 162 and the adjacent capacitor lateral surface 106 is equal to an obtuse angle of 135° (=180°−θ4), and the angle between each lateral chamfer 163 and the adjacent capacitor lateral surface 106 is equal to an obtuse angle of 135° (=180°−θ5). Still moreover, each chamfer 162 between the first capacitor major surface 102 and the corresponding lateral chamfer 161 has a chamfer angle of 45° with respect to the lateral chamfer 161, and each chamfer 163 between the second capacitor major surface 103 and the corresponding lateral chamfer 161 has a chamfer angle of 45° with respect to the lateral chamfer 161. Accordingly, the angle between the chamfer 162 and the lateral chamfer 161 is equal to an obtuse angle of 135° (=180°−45°), and the angle between the chamfer 163 and the lateral chamfer 161 is equal to an obtuse angle of 135° (=180°−45°). All the angles between two adjacent chamfers 162 and all the angles between two adjacent chamfers 163 are obtuse angles, so that all the angles between two adjacent surfaces of the ceramic sintered product 104 are obtuse angles.

As shown in FIGS. 1 to 4, the first capacitor major surface 102 of the ceramic sintered product 104 is provided with a plurality of first power-side electrodes (external electrodes) 111 and a first ground-side electrode (external electrode) 112 which are placed on the first capacitor major surface 102. Each first power-side electrode 111 is connected directly to one end surface of the corresponding power-side in-capacitor via conductor 131 at the first capacitor major surface 102. The first ground-side electrode 112 is connected directly to one end surfaces of the ground-side in-capacitor via conductors 132 at the first capacitor major surface 102. On the other hand, the second capacitor major surface 103 of the ceramic sintered product 104 is provided with a second power-side electrode (external electrode) 121 and a plurality of second ground-side electrodes (external electrodes) 122 which are placed on the second capacitor major surface 103. The second power-side electrode 121 is connected directly to one end surfaces of the power-side in-capacitor via conductors 131 at the second capacitor major surface 103. Each second ground-side electrode 122 is connected directly to one end surface of the corresponding ground-side in-capacitor via conductor 132 at the second capacitor major surface 103. In this way, the power-side electrodes 111 and 121 are conductive to the power-side in-capacitor via conductors 131 and power-side internal electrodes 141, whereas the ground-side electrodes 112 and 222 are conductive to the ground-side in-capacitor via conductors 132 and ground-side internal electrodes 142.

As shown in FIG. 1, the first power-side electrodes 111 and first ground-side electrode 112 at the first capacitor major surface 102 are electrically connected to the IC chip 21 through the via conductors 43, conductor layer 42, via conductors 47, terminal pads 44, and solder bumps 45, and the surface connection terminals 22 of the IC chip 21. On the other hand, the second power-side electrode 121 and second ground-side electrodes 122 at the second capacitor major surface 103 are electrically connected to electrodes (contacts) of the mother board through the via conductors 43, conductor layer 42, via conductors 47, BGA pads 48, and solder bumps 49.

As shown in FIGS. 1 to 4, the electrodes 111, 112, 121 and 122 are formed mainly of nickel. The surface of each electrode is entirely plated with a copper plating layer. The electrodes 111, 112, 121 and 122, and in-capacitor via conductors 131 and 132 are disposed substantially below the center of the IC chip 21. The thickness of each electrode 111, 112, 121 or 122 is set to about 20 μm to 40 μm in this example.

When the ceramic capacitor 101 is energized by the mother board side through the second power-side electrode 121 and second ground-side electrodes 122 so as to apply a voltage between each power-side internal electrode 141 and the corresponding ground-side internal electrode 142, then positive charge is accumulated in the power-side internal electrodes 141 and negative charge is accumulated in the ground-side internal electrodes 142, for example. As a result, the ceramic capacitor 101 functions as a capacitor. In the ceramic capacitor 101, the power-side in-capacitor via conductors 131 and ground-side in-capacitor via conductors 132 are arranged alternately and adjacent to one another, and the direction of a current flowing through the power-side in-capacitor via conductors 131 and the direction of a current flowing through the ground-side in-capacitor via conductors 132 are opposite to one another. This feature serves to reduce the inductance component.

Figure 3:
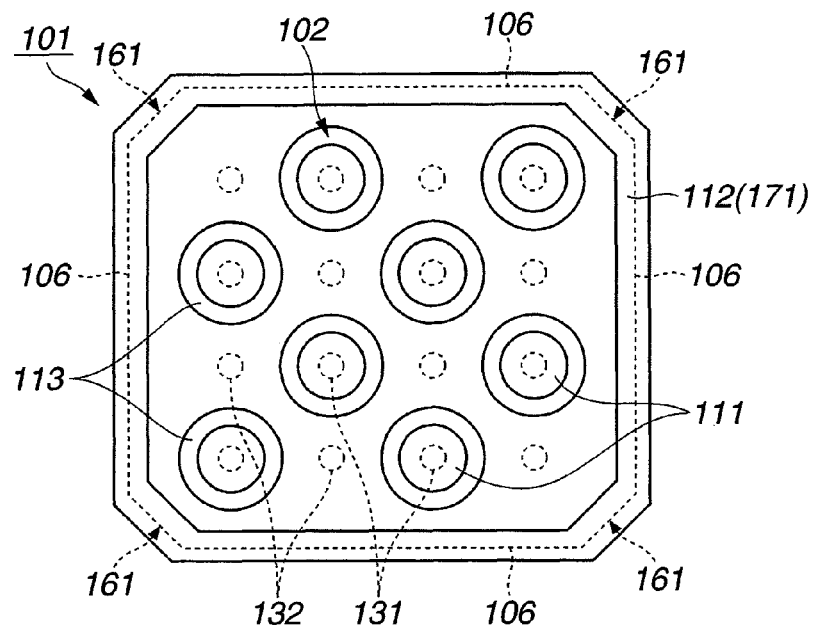
FIG. 3 is a schematic plan view of the ceramic capacitor according to the first embodiment, showing a first capacitor major surface of the ceramic capacitor.

As shown in FIGS. 2 and 3, the ceramic sintered product 104 is provided with a first metal layer 171 that is placed on the outer surface of the ceramic sintered product 104. The first metal layer 171 covers the entire corner portion 154 (chamfers 162) and the substantially entire first capacitor major surface 102. Namely, the size of the first metal layer 171 in the thickness direction of the ceramic sintered product 104 is substantially equal to the thickness of the cover layer section 108. The first metal layer 171 is formed integrally with the first ground-side electrode 112, and separated from the first power-side electrodes 111. In other words, the first metal layer 171 serves also as a ground-side conductive layer. Specifically, the first metal layer 171 (and first ground-side electrode 112) is a plane conductor which covers the substantially entire first capacitor major surface 102, and includes a plurality of clearances (a pattern of circular holes) 113 for separation from the first power-side electrodes 111. Each first power-side electrode 111 is a circular conductor having a diameter of about 500 μm, which is placed on the first capacitor major surface 102.

Figure 4:
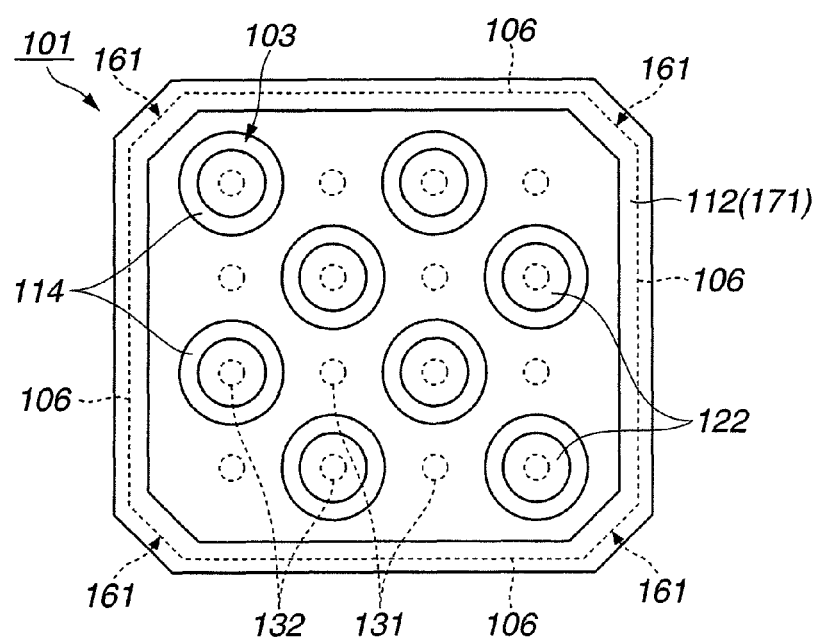
FIG. 4 is a schematic plan view of the ceramic capacitor according to the first embodiment, showing a second capacitor major surface of the ceramic capacitor.

As shown in FIGS. 2 and 4, the ceramic sintered product 104 is provided with a second metal layer 172 that is placed on the outer surface of the ceramic sintered product 104. The second metal layer 172 covers the entire corner portion 155 (chamfers 163) and the substantially entire second capacitor major surface 103. Namely, the size of the second metal layer 172 in the thickness direction of the ceramic sintered product 104 is substantially equal to the thickness of the cover layer section 109. The second metal layer 172 is formed integrally with the second power-side electrode 121, and separated from the second ground-side electrodes 122. In other words, the second metal layer 172 serves also as a power-side conductive layer. Specifically, the second metal layer 172 (and second power-side electrode 121) is a plane conductor which covers the substantially entire second capacitor major surface 103, and includes a plurality of clearances (a pattern of circular holes) 114 for separation from the second ground-side electrodes 122. Each second ground-side electrode 122 is a circular conductor having a diameter of about 500 µm, which is placed on the second capacitor major surface 103.

As shown in FIG. 2, the portion of each metal layer 171 or 172 covering the corner portion 154 or 155 has a curved outer surface. Specifically, the first metal layer 171 includes a connection portion 173 between the outer surface of the portion of the first metal layer 171 covering the corner portion 154 (chamfers 162) and the outer surface of the portion of the first metal layer 171 covering the first capacitor major surface 102, which has a curved surface of a radius of about 0.05 mm. Similarly, the second metal layer 172 includes a connection portion 174 between the outer surface of the portion of the second metal layer 172 covering the corner portion 155 (chamfers 163) and the outer surface of the portion of the second metal layer 172 covering the second capacitor major surface 103, which has a curved surface of a radius of about 0.05 mm. This feature serves to suppress the stress concentration at the metal layers 171 and 172, so as to prevent the occurrence of a crack in the filler 92, when the filler 92 deforms due to temperature change.

The first and second metal layers 171 and 172 are formed mainly of nickel in the same manner as the electrodes 111, 112, 121 and 122, and the surface of each metal layer is plated by a copper plating layer not shown. The thickness of each metal layer 171 or 172 is equal to from 5 µm to 40 µm (specifically, from 20 µm to 40 µm, in this example), and greater than the thickness of the internal electrodes 141 and 142, and equal to the thickness of the electrodes 111, 112, 121 and 122. The thickness of each metal layer 171 or 172 is nonuniform. Specifically, the thickness of the curved portion of each metal layer 171 or 172 is smaller than that of the straight portion of the metal layer 171 or 172. The thickness of the portion of each metal layer 171 or 172 covering the chamfers 162 or 163 is equal to the thickness of the portion of the metal layer 171 or 172 covering the capacitor major surface 102 or 103. The thickness of the portion of each metal layer 171 or 172 covering the chamfers 162 or 163 may be set different from, i.e. larger than or smaller than that of the portion of the metal layer 171 or 172 covering the capacitor major surface 102 or 103. The thickness of each metal layer 171 or 172 may be however uniform alternatively.

The ceramic capacitor 101 is prepared by the following process. The preparing process starts from an operation of forming a first green sheet of ceramics having a thickness of about 7 µm, and a second green sheet of ceramics having a thickness of about 30 µm. Subsequently, the process proceeds to an operation of screen-printing a nickel paste on the first green sheet, and drying it up, for forming power-side internal electrode portions each of which is to form the power-side internal electrode 141, and ground-side internal electrode portions each of which is to form the ground-side internal electrode 142.

Subsequently, the process proceeds to an operation of layering the second green sheets on a support member not shown, thus forming a portion which is to form the upper cover layer section 108. The process proceeds to an operation of layering the first green sheets formed with the power-side internal electrode portions and the first green sheets formed with the ground-side internal electrode portions, alternately on a surface of the top second green sheet (on the lower surface of the portion which is to form the cover layer section 108), thus forming a portion which is to form the capacitor-forming layer section 107. The process proceeds to an operation of layering the second green sheets on a surface of the top first green sheet (on the upper surface of the portion that is to form the capacitor-forming layer section 107), thus forming a portion that is to form the cover layer section 109. In this way, the green sheets are integrated together, to form a green sheet layered product in which a plurality of square product regions (portions that are to form the ceramic capacitors 101) are arranged longitudinally and laterally in the horizontal directions. This operation is referred to layering operation.

The process then proceeds to an operation of forming the green sheet layered product with a lot of via holes 130 by laser processing with a laser processing machine. The process proceeds to an operation of filling a nickel paste for via conductor (via conductor forming material) in each via hole 130 with a paste pressing and filling machine.

Thereafter, the process proceeds to an operation of applying a pressing force to the green sheet layered product at higher temperature and higher pressure than in the layering operation, thus ensuring the integration of the green sheet layered product. The process proceeds to an operation of applying a laser beam along the outlines of each product region, to form a break groove useful for separating the product regions from one another. Simultaneously, a laser beam is applied to each portion of the green sheet layered product where the outlines of each product region cross one another (i.e. each corner portion of each product region), to form a through hole for forming the lateral chamfer 161 at the boundary between two adjacent capacitor lateral surfaces 106.

Subsequently, the process proceeds to an operation of degreasing the green sheet layered product, and burning or firing the same under reducing atmosphere for a predetermined time period. This operation is referred to as firing operation. The firing temperature is a temperature of about 1300° C. at which barium titanate can be sintered. As a result, barium titanate in the first and second green sheets is sintered, to form the ceramic sintered product 104. Simultaneously, nickel in the power-side internal electrode portions and the ground-side internal electrode portions is sintered, to form the internal electrodes 141 and 142. Moreover, nickel in the nickel paste for via conductor is sintered, to form the in-capacitor via conductors 131 and 132.

The process then proceeds to an operation of forming the chamfers 162 (corner portion 154) at a boundary between the first capacitor major surface 102 and a set of the capacitor lateral surfaces 106 and lateral chamfers 161 by a grinder attached with a sand paper, and an operation of forming the chamfers 163 (corner portion 155) at a boundary between the second capacitor major surface 103 and a set of the capacitor lateral surfaces 106 and the lateral chamfers 161. Alternatively, instead of the grinding after firing, the operation of forming the lateral chamfers 161 and chamfers 162 and 163 may be implemented by applying a V-shaped bit or U-shaped bit or applying laser processing.

Subsequently, the process proceeds to an operation of printing a nickel paste on the first capacitor major surface 102 of the ceramic sintered product 104, to form external electrode portions each of which covers the upper end surface of the corresponding power-side in-capacitor via conductor 131. Simultaneously, a nickel paste is printed on the first capacitor major surface 102 and chamfers 162 (corner portion 154), to form an external electrode portion (metal layer section) that covers the upper end surfaces of the ground-side in-capacitor via conductors 132 and the corner portion 154. Similarly, a nickel paste is printed on the second capacitor major surface 103 and chamfers 163 (corner portion 155) of the ceramic sintered product 104, to form an external electrode portion (metal layer section) that covers the lower end surfaces of the power-side in-capacitor via conductors 131 and the corner portion 155. Simultaneously, a nickel paste is printed on the second capacitor major surface 103, to form external electrode portions each of which covers the lower end surface of the corresponding ground-side in-capacitor via conductor 132. Then, the process proceeds to an operation of degreasing the external electrode portions, and firing the same under oxidizing atmosphere for a predetermined time period. The firing temperature is set to about 800 to 1000° C. As a result, nickel in the external electrode portions is sintered, to form the electrodes 111, 112, 121 and 122 (first and second metal layers 171 and 172).

The process then proceeds to an operation of plating the electrodes 111, 112, 121 and 122 (first and second metal layers 171 and 172) of the ceramic sintered product 104 by electroless plating (into a thickness of about 20 μm). As a result, each electrode 111, 112, 121 or 122 (metal layer 171 or 172) is formed with a copper plating layer on its outer surface, thus completing a plate panel in which a plurality of ceramic capacitors 101 are arranged longitudinally and laterally in the horizontal directions. Finally, the plate panel is cut along the break grooves, to separate the product regions from one another, thus forming a plurality of separated ceramic capacitors 101.

The operation of mounting the ceramic capacitor 101 into the wiring board 10 is implemented by the following process. The process starts from an operation of preparing the core board 11 formed with the accommodation hole 91, by a common method. Then, the process proceeds to an operation of accommodating the ceramic capacitor 101 in the accommodation hole 91 of the core board 11, and filing the filler 92, which is made of a thermosetting resin, in the space between the inside periphery of the accommodation hole 91 and the capacitor lateral surfaces 106 of the ceramic capacitor 101. Thereafter, the process proceeds to an operation of heating the filler 92, to harden the filler 92, and thereby fix the ceramic capacitor 101 in the accommodation hole 91.

Subsequently, the process proceeds to an operation of forming the major surface side buildup layer 31 on the core major surface 12 of the core board 11 and the first capacitor major surface 102 of the ceramic capacitor 101, and forming the back surface side buildup layer 32 on the core back surface 13 of the core board 11 and the second capacitor major surface 103 of the ceramic capacitor 101. The process thus completes the wiring board 10 that is composed of the core board 11, and buildup layers 31 and 32.

The first embodiment produces at least the following advantageous effects <1> to <6>.

Figure 13:
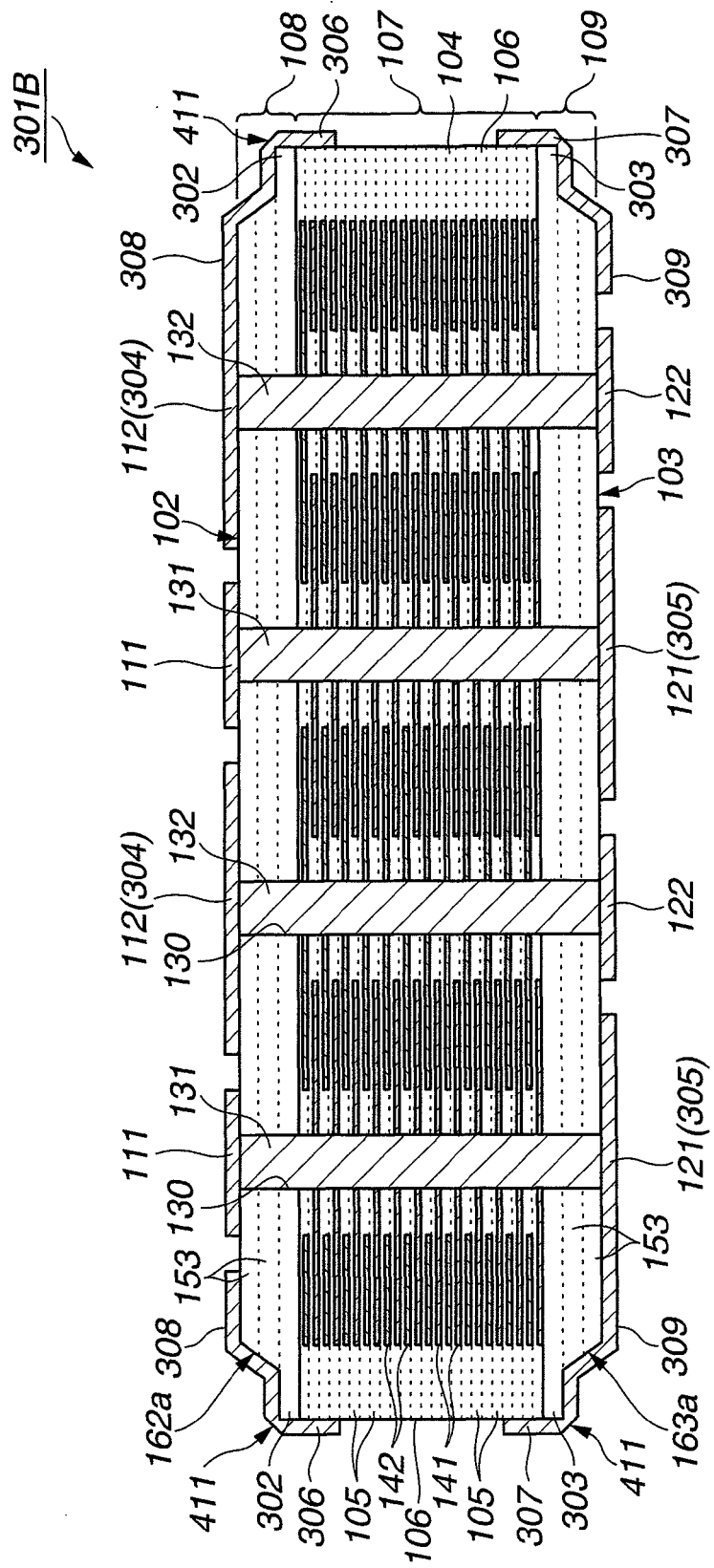
FIG. 13 is a schematic sectional view of a ceramic capacitor according to a modification of the first embodiment.

<1> In the first embodiment, while the ceramic capacitor 101 is fixed to the accommodation hole 91 of the core board 11 with the filler 92 during the operation of mounting the ceramic capacitor 101, the filler 92 hardens and shrinks by heating. On the other hand, during the operation of layering the buildup layers 31 and 32 on the core major surface 12 and core back surface 13 of the core board 11, resin insulator films for forming the resin interlayer insulation layers 33, 34, 35 and 36 harden and shrink by pressing and heating. These shrinkages can cause an external stress applied on the outer surface of the ceramic capacitor 101. This phenomenon is relatively significant, if the size of the ceramic capacitor 101 is large so that the contact area between the first capacitor major surface 102 and resin interlayer insulation layer 33 or between the second capacitor major surface 103 and resin interlayer insulation layer 34 is large. In such cases, it is likely that the external stress applied to the capacitor major surface 102 or 103 is large, which is concentrated at the corner portions 154 and 155 of the ceramic capacitor 101. However, according to the first embodiment, the feature of the ceramic capacitor 101 that the brittle ceramic dielectric layers 153 at the corner portions 154 and 155 are covered by the first and second metal layers 171 and 172, is effective for enhancing the toughness of the ceramic sintered product 104. This feature serves to prevent the occurrence of such a crack 221 as shown in FIG. 13 close to the corner portion 154 or 155 of the ceramic capacitor 101, even when an external stress is concentrated at the corner portion 154 or 155 due to the heating history after the mounting to the wiring board 10.

<2> The feature that the first metal layer 171 covers not only the chamfers 162 (corner portion 154) but also the first capacitor major surface 102, is effective for preventing the formation of asperities in the first capacitor major surface 102. Similarly, the feature that the second metal layer 172 covers not only the chamfers 163 (corner portion 155) but also the second capacitor major surface 103, is effective for preventing the formation of asperities in the second capacitor major surface 103. As a result, the strength of bonding between the ceramic capacitor 101 and resin interlayer insulation layers 33 and 34 is enhanced. This feature is also effective for enhancing the flatness of the surfaces of the major surface side buildup layer 31 and back surface side buildup layer 32, and thereby making it easy to mount the IC chip 21. In this way, this feature is effective for preventing the detachment or de-lamination of the major surface side buildup layer 31 and back surface side buildup layer 32, for example, due to thermal expansion, and thereby enhancing the reliability of the wiring board 10.

<3> The first metal layer 171 is formed integrally with the first ground-side electrode 112 on the outer surface of the ceramic sintered product 104, while the first metal layer 171 functions also as a ground-side conductor layer. Similarly, the second metal layer 172 is formed integrally with the second power-side electrode 121 on the outer surface of the ceramic sintered product 104, while the second metal layer 172 functions also as a power-side conductor layer. Naturally, the first and second metal layers 171 and 172 are formed simultaneously with formation of the first ground-side electrode 112 and second power-side electrode 121, respectively. Namely, this feature makes it possible to easily form the ceramic capacitor 101, because it is unnecessary to form the first and second metal layers 171 and 172, and the first ground-side electrode 112 and second power-side electrode 121 independently. The feature is also effective for resistance reduction, because the areas of the ground-side conductor layer and the power-side conductor layer are relatively large.

<4> The feature that all the angles between two adjacent surfaces of the ceramic sintered product 104 are obtuse angles, is effective for preventing the occurrence of cracks in the filler 92, and thereby enhancing the reliability of the wiring board 10, because the outer surface of the ceramic sintered product 104 includes no portion where stress is likely concentrated.

<5> The feature that the ceramic capacitor 101 is disposed just below the IC chip 21 that is mounted on the IC-chip-mounting space 23, is effective for shortening the wiring between the ceramic capacitor 101 and the IC chip 21, and thereby suppressing the inductance component as to the wiring. Accordingly, this feature is effective for suppressing switching noise in the IC chip 21 caused by the ceramic capacitor 101, and stabilizing the supply voltage. Moreover, this feature is effective for enhancing the reliability while preventing malfunctions, because the noise trapped between the IC chip 21 and ceramic capacitor 101 is significantly suppressed.

<6> The feature that the IC-chip-mounting space 23 is located just above the ceramic capacitor 101, means that the IC chip 21 mounted on the IC-chip-mounting space 23 is supported by the ceramic capacitor 101 that is highly rigid and has a small thermal expansion coefficient. This feature is effective for suppressing deformation of the major surface side buildup layer 31 at the IC-chip-mounting space 23, and thereby supporting the IC chip 21 stably on the IC-chip-mounting space 23. Accordingly, the IC chip 21 may be a large IC chip having a size of 10 mm×10 mm or larger which generally generates a large amount of heat, and thereby is likely influenced by thermal stress, or a low-k (low dielectric constant) IC chip.

Figure 8:
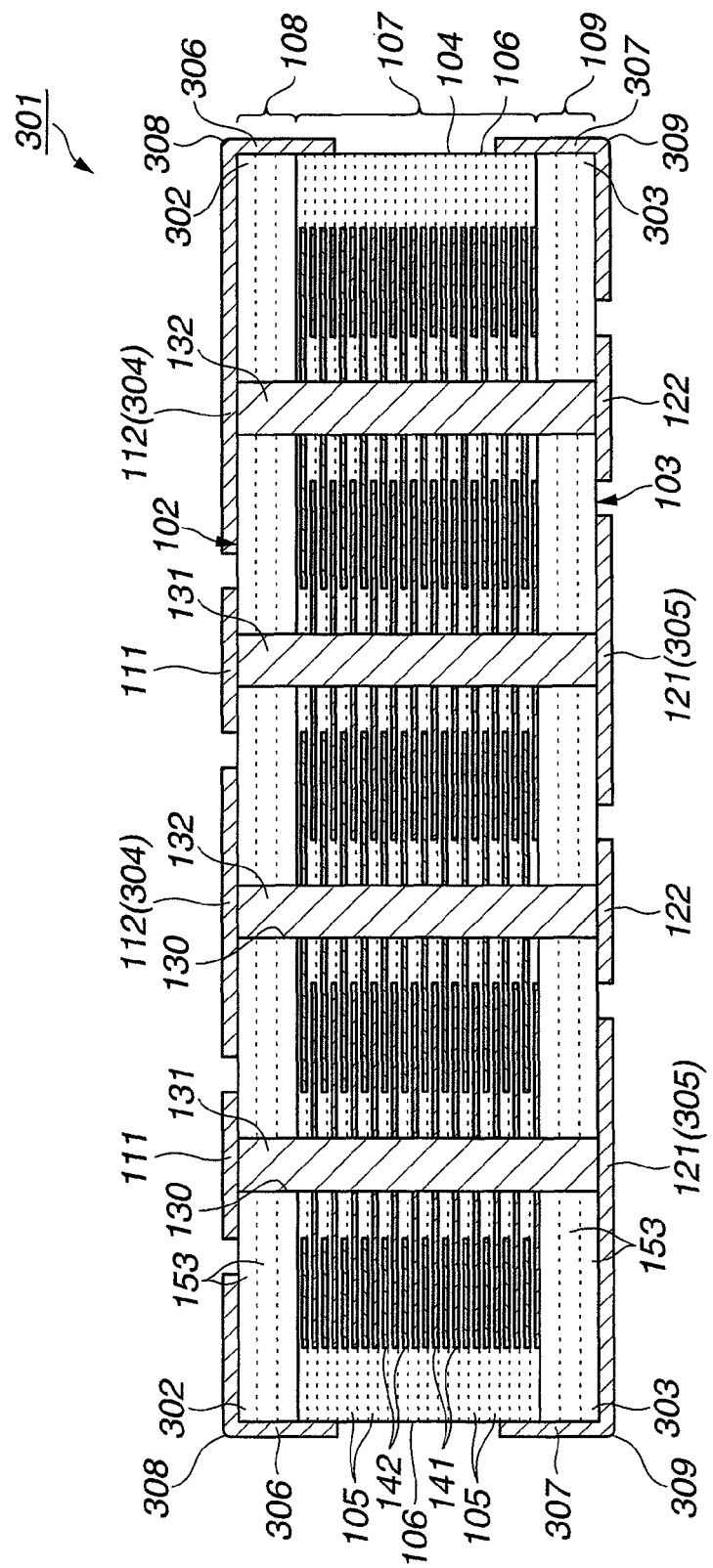
FIG. 8 is a schematic sectional view of a ceramic capacitor according to a second embodiment of the present invention.

<Second Embodiment> FIG. 8 schematically shows a ceramic capacitor according to a second embodiment of the present invention. In the following, components that are common between the first embodiment and the second embodiment are indicated by the same reference characters, and detailed description for the components is omitted.

As shown in FIG. 8, a ceramic capacitor 301 according to the second embodiment differs from the first embodiment in that the cover layer section 108 or 109 includes a corner portion 302 or 303 which is not formed with the chamfers 162 or 163 as shown in FIG. 2. Moreover, the shape of a metal layer 304 or 305 covering the corner portion 302 or 303 differs from the shape of metal layer 171 or 172 according to the first embodiment.

Specifically, the first metal layer 304 includes a first lateral surface cover portion 306 that covers end portions of the capacitor lateral surfaces 106 closer to the first capacitor major surface 102. Similarly, the second metal layer 305 includes a second lateral surface cover portion 307 that covers end portions of the capacitor lateral surface 106 closer to the second capacitor major surface 103. The size of the first lateral surface cover portion 306 in the thickness direction of the ceramic sintered product 104 is set larger than the thickness of the cover layer section 108. Similarly, the size of the second lateral surface cover portion 307 in the thickness direction of the ceramic sintered product 104 is set larger than the thickness of the cover layer section 109.

The metal layer 304 or 305 covering the corner portion 302 or 303 has a curved outer surface. Specifically, the first metal layer 304 covering the corner portion 302 has a curved outer surface 308 having a radius of curvature of about 0.05 mm. Similarly, the second metal layer 305 covering the corner portion 303 has a curved outer surface 309 having a radius of curvature of about 0.05 mm. This feature is effective for relieving the stress concentration at the metal layer 304 or 305 when the filler 92 deforms due to temperature change, and thereby preventing the occurrence of cracks in the filler 92.

The feature that the metal layer 304 or 305 includes the lateral surface cover portion 306 or 307 whose length is larger than the thickness of the cover layer section 108 or 109, is effective for further reinforcing the cover layer section 108 or 109 which is formed only of the ceramic dielectric layers 153, and thereby has a relatively low toughness. This serves to enhance the toughness of the ceramic sintered product 104, and thereby prevent the occurrence of such a crack 221 as shown in FIG. 13 close to the corner portion 302 or 303 of the ceramic capacitor 301.

<Modifications> The first and second embodiments may be modified variously, as described in the following items <M1> to <M11>.

<M1> In the first and second embodiments, the first metal layer 171 (or first metal layer 304) is formed integrally with the first ground-side electrode 112, and the second metal layer 172 (or second metal layer 305) is formed integrally with the second power-side electrode 121. This construction may be modified so that the first metal layer 171 (or first metal layer 304) is formed as a member separated from the first ground-side electrode 112, and/or the second metal layer 172 (or second metal layer 305) is formed as a member separated from the second power-side electrode 121. In such cases, the metal layer 171 or 172 (metal layer 304 or 305) may be formed to cover only the corner portion 154 or 155 (corner portion 302 or 303). Alternatively, the metal layer 171 or 172 (metal layer 304 or 305) may be formed to cover the corner portion 154 or 155 (corner portion 302 or 303), and also cover the capacitor major surface 102 or 103, while being separated from all the electrodes 111, 112, 121 and 122.

Figure 9:
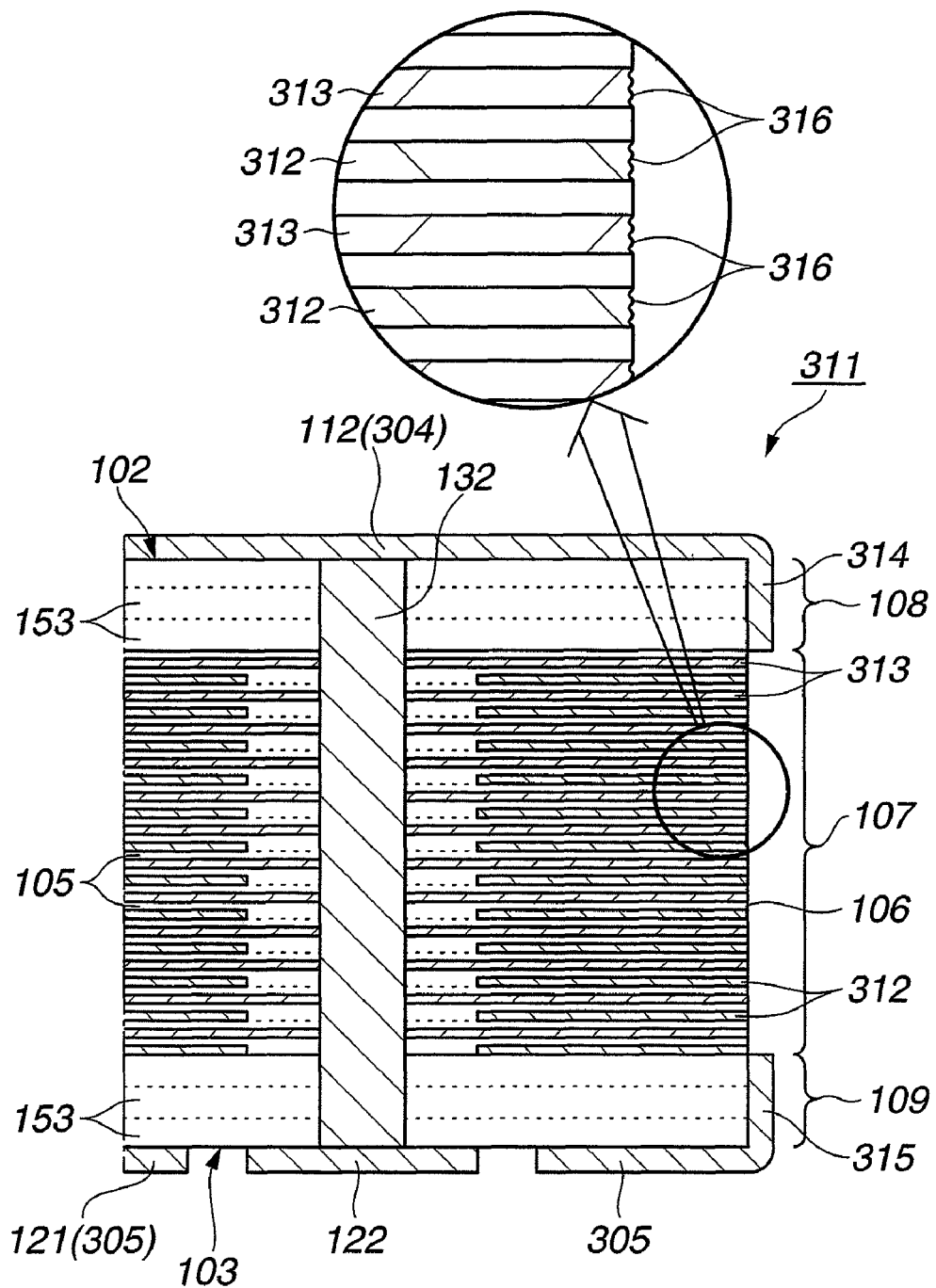
FIG. 9 is a schematic partial sectional view of a ceramic capacitor according to a modification of the second embodiment.

<M2> In the ceramic capacitor 301 according to the second embodiment, the size of the lateral surface cover portion 306 or 307 in the thickness direction of the ceramic sintered product 104 is set larger than the thickness of the cover layer section 108 or 109. This construction may be modified, for example, as shown in FIG. 9 where in a ceramic capacitor 311, the size of a lateral surface cover portion 314 or 315 in the thickness direction of the ceramic sintered product 104 is set equal to the thickness of the cover layer section 108 or 109. In this construction, the capacitor-forming layer section 107 may be provided with internal electrodes (power-side internal electrodes 312 and ground-side internal electrodes 313) each of which has an end surface exposed at the capacitor lateral surface 106. This construction is effective for enhancing the toughness of the ceramic sintered product 104, while preventing failures (short circuit, etc.) resulting from connection between the power-side internal electrodes 312 and ground-side internal electrodes 313 through the lateral surface cover portion 314 or 315. The exposed end surface of the internal electrode 312 or 313 may be formed with microscopic asperities 316 as shown in FIG. 9. This feature is effective for producing an effect that when the ceramic capacitor 311 is mounted in the wiring board 10, the filler 92 in contact with the outer surface of the ceramic sintered product 104 easily permeates the microscopic asperities 316. Accordingly, the feature serves to enhance the strength of bonding between the ceramic capacitor 311 and filler 92, and thereby enhance the reliability of the wiring board 10. The feature that part of the end surfaces of the internal electrode 312 or 313 is exposed at the capacitor lateral surface 106, makes it possible to increase the area of the internal electrode 312 or 313, and thereby increase the capacity of the ceramic capacitor 311. Moreover, a dummy electrode may be formed on the ceramic dielectric layer 105 on which the internal electrodes 312 and 313 are formed, wherein the dummy electrode surrounds the internal electrodes 312 and 313, and is electrically separated from the internal electrodes 312 and 313, and exposed at the capacitor lateral surface 106.

<M3> In the wiring board 10 according to the present embodiments, the ceramic capacitor 101 is mounted in the accommodation hole 91 that has openings in the core major surface 12 and core back surface 13 of the core board 11. For example, this construction may be modified so that the accommodation hole 91 is a recess having an opening only in the core major surface 12 of the core board 11, in which the ceramic capacitor 101 is mounted.

<M4> In the present embodiments, the ceramic capacitor 101 or 301 is mounted inside the core board 11. The ceramic capacitor 101 or 301 may be however modified into a thinner ceramic capacitor (for example, with a thickness of about 0.08 mm) that is mounted inside the major surface side buildup layer 31, for example.

In that case, a resin sheet (resin interlayer insulation layer 33 before hardened) is laminated on the core major surface 12 of the core board 11, and the ceramic capacitor is mounted on the resin sheet by means of a mounting device (for example, supplied by YAMAHA Motor, Co., Ltd.) before the resin sheet is hardened. At the moment, part of the ceramic capacitor (electrodes 121 and 122 at the second capacitor major surface 103) is buried in the resin sheet under pressure, thus positioning the ceramic capacitor. Then, the resin sheet is hardened into the resin interlayer insulation layer 33. Then, the resin interlayer insulation layer 35 and conductor layer 42 are formed alternately, thus completing the major surface side buildup layer 31.

The above feature is effective for shortening a conduction path for electrical connection (capacitor connection wiring) between the IC chip 21 and the ceramic capacitor 101 or 301, as compared to cases where the ceramic capacitor 101 or 301 is mounted inside the core board 11. Accordingly, this feature is effective for suppressing switching noise in the IC chip 21 caused by the ceramic capacitor 101 or 103, and stabilizing the supply voltage. Moreover, this feature is effective for enhancing the reliability while preventing malfunctions, because the noise trapped between the IC chip 21 and ceramic capacitor 101 is significantly suppressed.

<M5> In the ceramic capacitor 101 or 301, the first capacitor major surface 102 of the ceramic sintered product 104 is provided with the cover layer section 108, and the second capacitor major surface 103 of the ceramic sintered product 104 is provided with the cover layer section 109. This construction may be modified so that only one of the first and second capacitor major surfaces 102 and 103 is provided with the cover layer section 108 or 109.

<M6> The chamfers 162 and 163, and lateral chamfers 161 are substantially flat, but may be curved chamfers. Specifically, the chamfers may be formed with no angled corners. This feature is effective for suppressing stress concentration more reliably. However, the flat chamfers are advantageous in formation, because the flat shapes can be easily and accurately formed, as compared to the curved chamfers.

<M7> In the ceramic capacitor 101 according to the first embodiment, the chamfers 162 are formed at the boundary between the first capacitor major surface 102 and the set of the capacitor lateral surfaces 106 and the lateral chamfers 161, whereas the chamfers 163 are formed at the boundary between the second capacitor major surface 103 and the set of the capacitor lateral surfaces 106 and the lateral chamfers 161. However, the chamfers 162 and/or 163 may be omitted.

Figure 14:
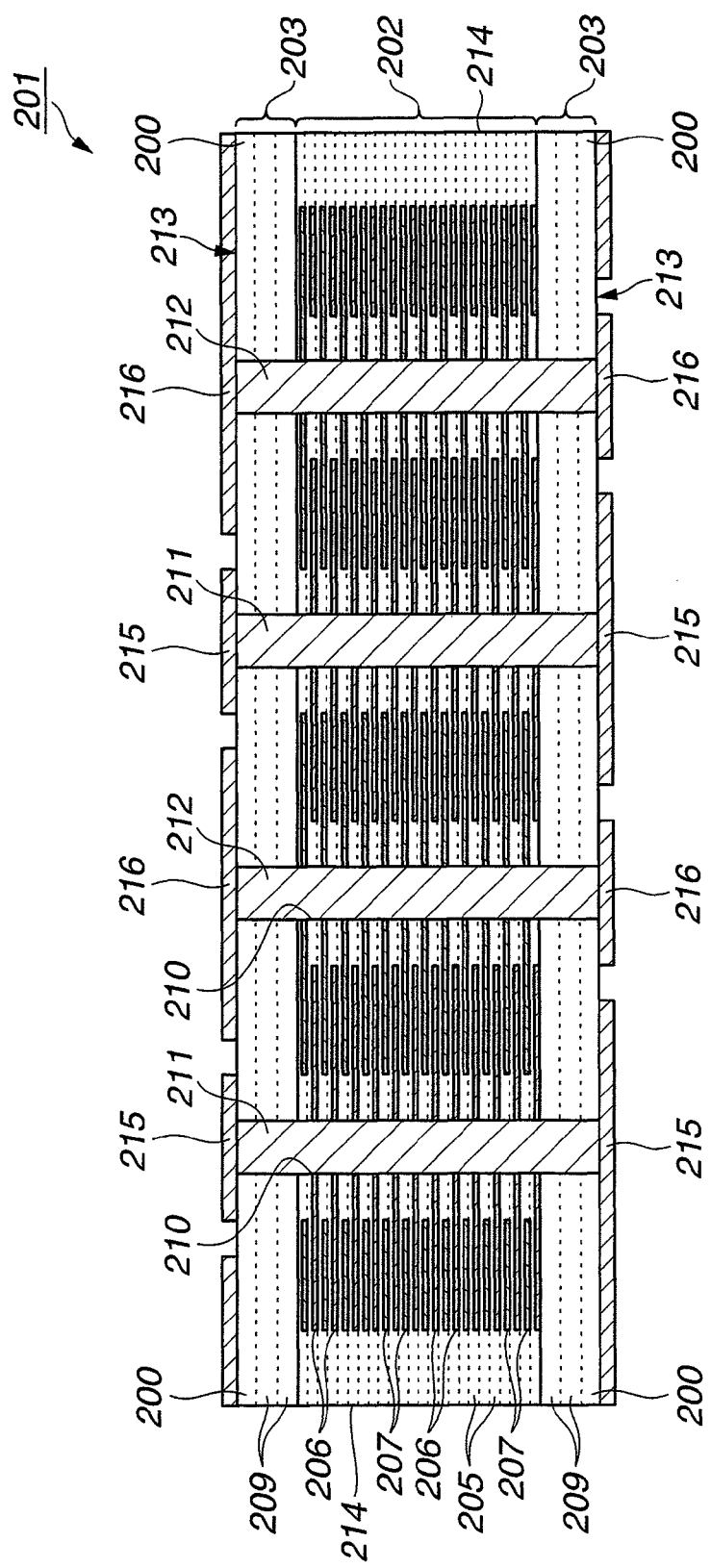
FIG. 14 is a schematic sectional view of a ceramic capacitor according to a reference example.
Figure 15:
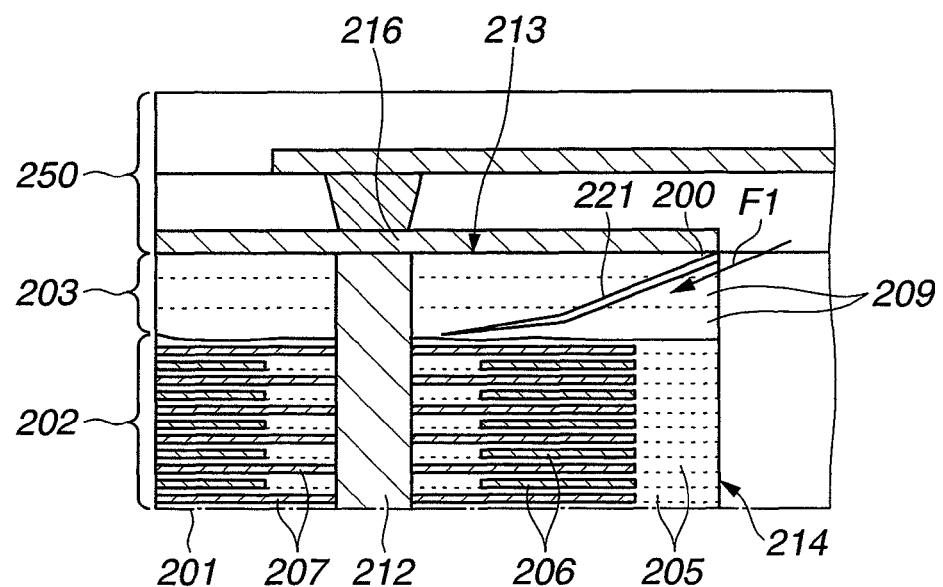
FIG. 15 is a schematic enlarged partial sectional view of the ceramic capacitor according to the reference example, showing a crack in a cover layer section of the ceramic capacitor.
Figure 16:
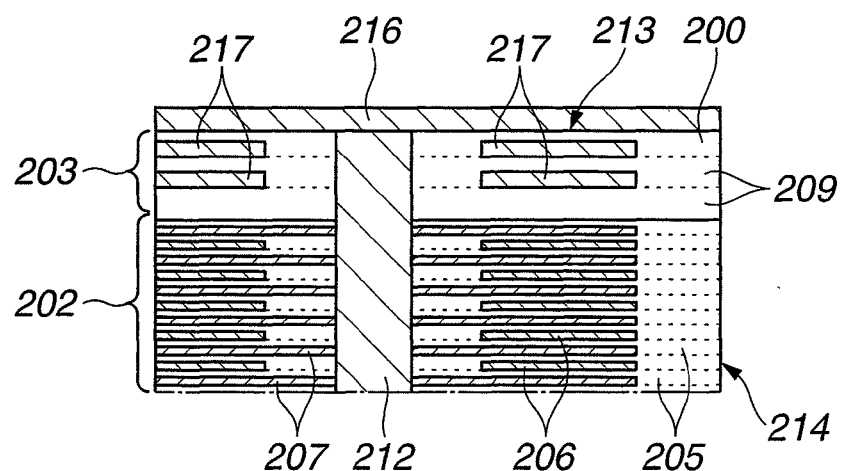
FIG. 16 is a schematic enlarged partial sectional view of a ceramic capacitor according to a modification of the reference example.

<M8> The cover layer section 108 or 109 is composed only of the plurality of the ceramic dielectric layers 153, but may be modified so that the cover layer section 108 or 109 is composed of the plurality of the ceramic dielectric layers 153, and dummy electrodes 217 as shown in FIG. 14 which are layered alternately, where the dummy electrodes 217 are electrically separated from the in-capacitor via conductors 131 and 132. It is preferable that each dummy electrode 217 has a wide area. For example, the dummy electrode 217 may be in the form of a plain conductor pattern (solid pattern) which is disposed around and with a clearance to the in-capacitor via conductors 131 and 132. This construction is effective for enhancing the toughness of the cover layer sections 108 and 109 of the ceramic sintered product 104 by all of the first and second metal layers 171 and 172 (first and second metal layers 304 and 305) and the dummy electrodes 217. This feature is effective for preventing the occurrence of such a crack 221 as shown in FIG. 13 in the outer peripheries of the cover layer sections 108 and 109 more reliably.

<M9> The package form of the wiring board 10 is of a BGA (ball grid array) type, but not so limited. The package form may be of a PGA (pin grid array), an LGA (land grid array) type, etc.

Figure 10:
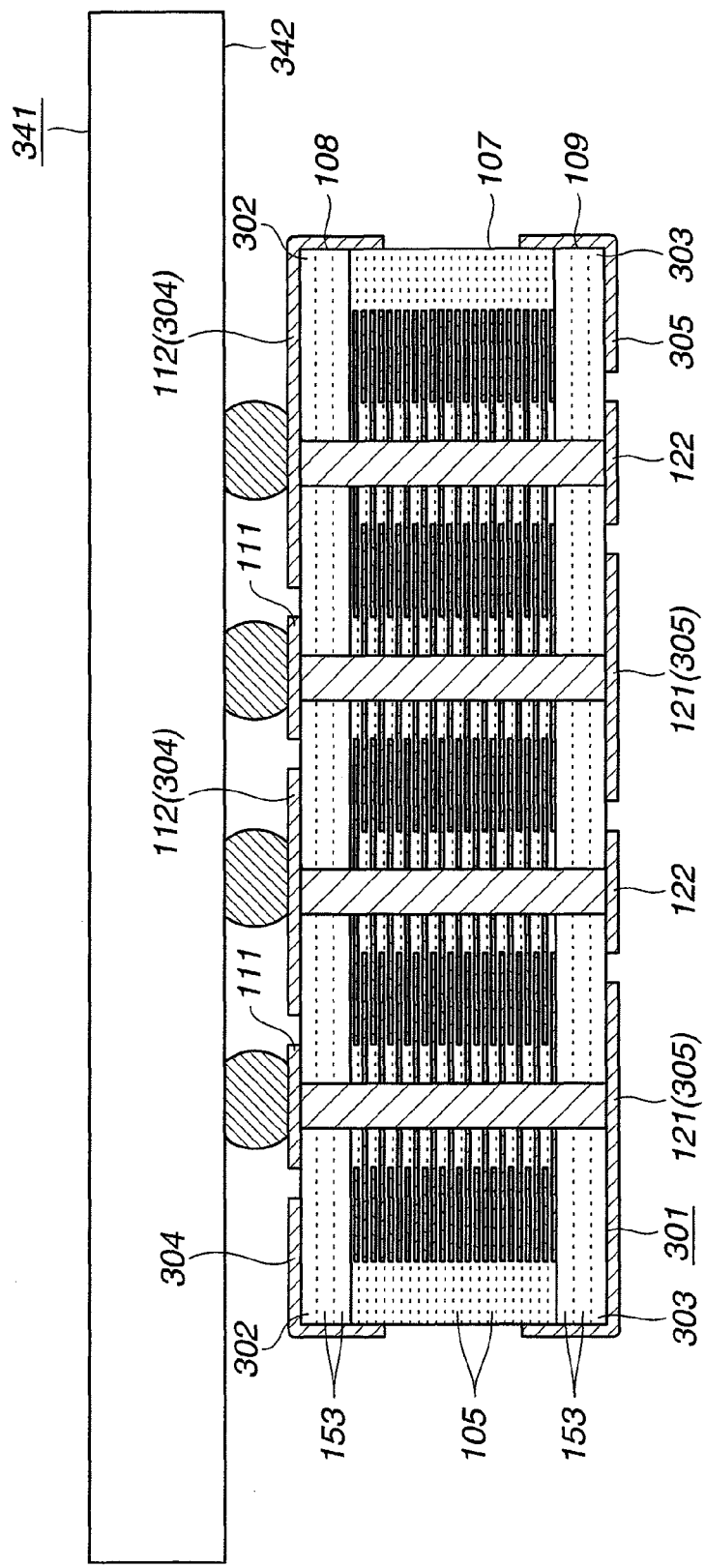
FIG. 10 is a schematic sectional view of a wiring board according to a modification of the second embodiment.

<M10> The ceramic capacitor 101 or 301 is mounted inside the wiring board 10, but may be mounted on the board major surface of the wiring board 10, as shown in FIG. 10. In FIG. 10, a wiring board 341 is provided with a ceramic capacitor 301 that is mounted on a board major surface 342 of the wiring board 341 by flip chip mounting. When the ceramic capacitor 301 is mounted on the wiring board 341 by soldering, the surface of the ceramic capacitor 301 is subject to a compression stress due to a difference in thermal expansion between the wiring board 341 and ceramic capacitor 301. The toughness of the ceramic capacitor 301 is sufficiently ensured by the structure that the brittle ceramic dielectric layers 153 at the corner portions 302 and 303 are covered by the first and second metal layers 304 and 305. This construction is effective for preventing the occurrence of cracks near the corner portion 302 or 303 of the ceramic capacitor 301, even if an external stress is concentrated at the corner portion 302 or 303 when the ceramic capacitor 301 is mounted on the wiring board 341. This enhances the reliability of the wiring board 341.

Figure 11:
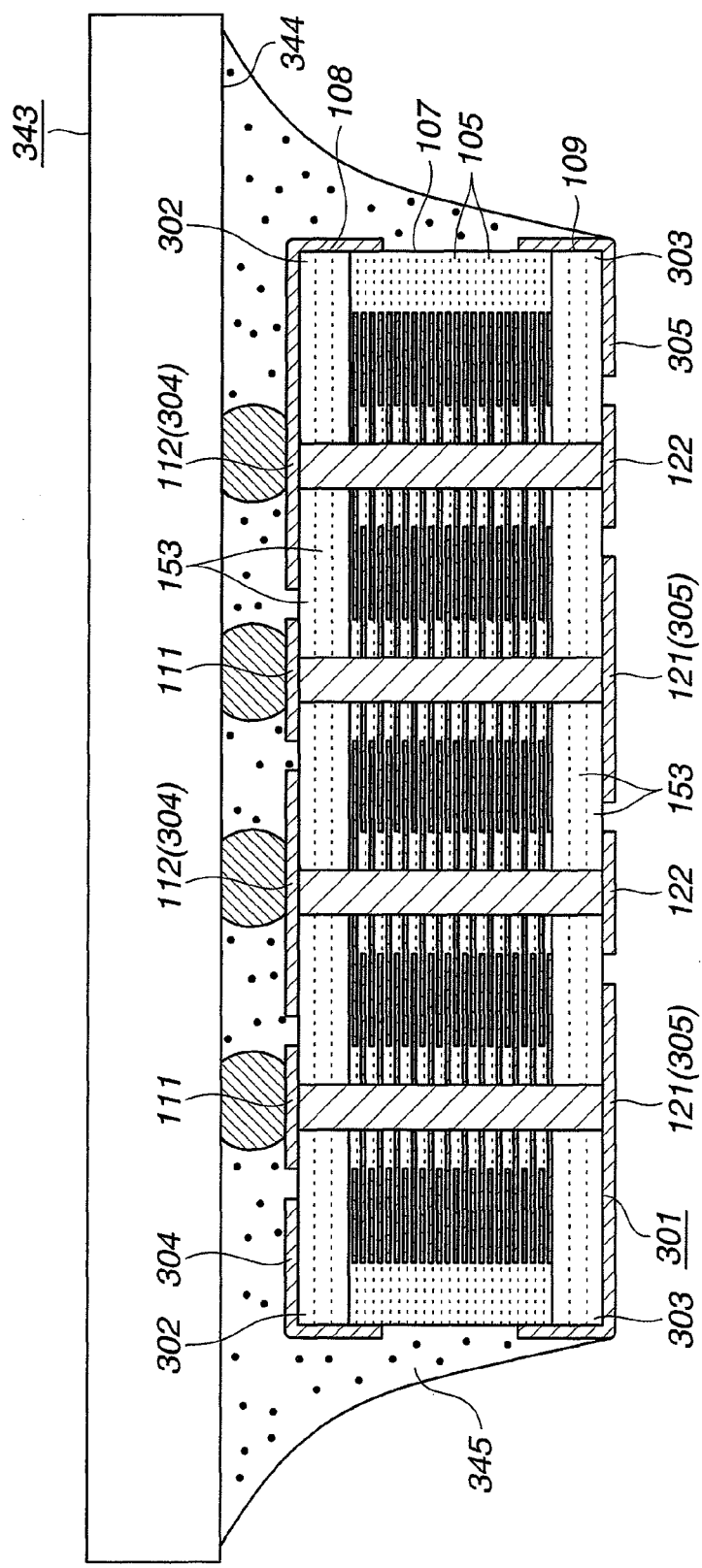
FIG. 11 is a schematic sectional view of a wiring board according to a modification of the second embodiment.

FIG. 11 shows a further modification in which a wiring board 343 is provided with an underfill material (resin material) 345 that seals a space between a board major surface 344 of the wiring board 343 and a ceramic capacitor 301. The ceramic capacitor 301 is subject to a tension stress due to thermal hardening and shrinkage of the underfill material 345 during a sealing operation with the underfill material 345. The toughness of the ceramic capacitor 301 is sufficiently ensured by the structure that the ceramic dielectric layers 153 at the corner portions 302 and 303 are covered by the first and second metal layers 304 and 305. This construction is effective for preventing the occurrence of cracks at the outer periphery of the ceramic capacitor 101, even when the ceramic capacitor 301 is subject to a tension stress due to thermal hardening and shrinkage of the underfill material 345 during the sealing operation with the underfill material 345.

Figure 12:
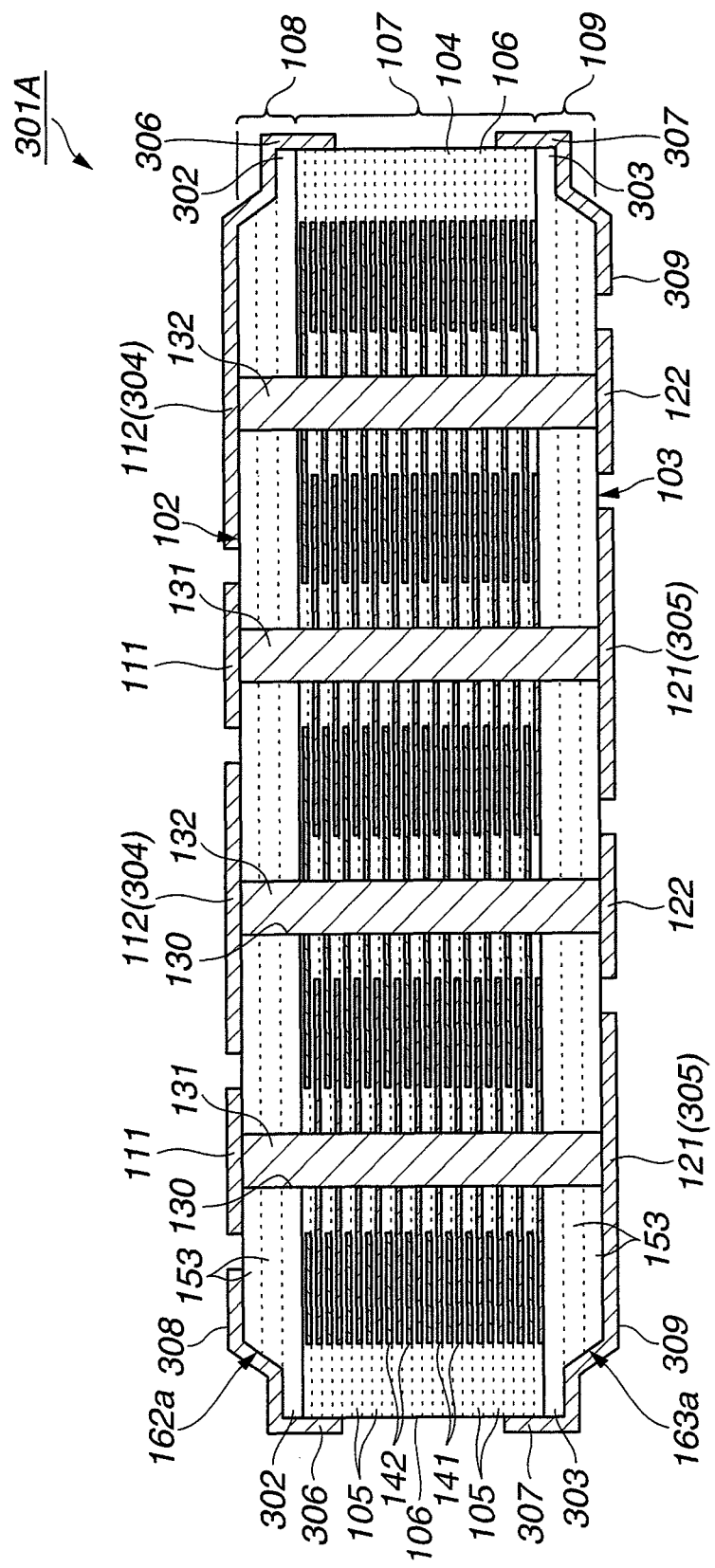
FIG. 12 is a schematic sectional view of a ceramic capacitor according to a modification of the first embodiment.

<M11> In the first embodiment, the ceramic capacitor 101 according to the first embodiment is constructed so that the chamfers 162 are formed at the boundary between the first capacitor major surface 102 and capacitor lateral surfaces 106, and the chamfers 163 are formed at the boundary between the second capacitor major surface 103 and capacitor lateral surfaces 106. In contrast, FIG. 12 schematically shows a modification in which a ceramic capacitor 301A is provided with tapered step portions 162a and 163a at the peripheries of the capacitor major surfaces 102 and 103, respectively, which are formed without chamfering operation. The tapered step portions 162a and 163a may be formed intentionally, or formed naturally, for example, by the existence or non-existence of conductors in the internal layer. The corner portion 302 or 303 at the cover layer section 108 or 109 of the ceramic capacitor 301A is located at the boundary where the capacitor major surface 102 or 103 intersects with the capacitor lateral surfaces 106 at a right angle. Accordingly, the corner portion 302 or 303 of the ceramic capacitor 301A differs from the corner portion 154 or 155 of the ceramic capacitor 101 according to the first embodiment, somewhat in position, and also in angle. Namely, the corner portion 302 or 303 has a right angle, whereas the corner portion 154 or 155 has an obtuse angle. The feature of the ceramic capacitor 301A that the corner portion 302 or 303 having a right angle is covered by the metal layer 304 or 305 is effective for preventing the occurrence of cracks at that portion. FIG. 13 shows a further modification in which in a ceramic capacitor 301B, the metal layer 304 or 305 covering the corner portion 302 or 303 is formed with a chamfer 411 by chamfering operation. This construction is effective for preventing the occurrence of cracks more reliably. The construction shown in FIGS. 12 and 13 that the metal layer 304 or 305 covers part of each capacitor lateral surface 106, may be modified so that the metal layer 304 or 305 covers the entire capacitor lateral surface 106.

<Technical Features And Advantageous Effects>

The following summarizes technical features of the embodiments described above and advantageous effects produced by the technical features.

According to a first technical concept, a ceramic capacitor (101, 301, 301A, 301B, 311) comprises: a capacitor body (104) including an outer surface (102, 103, 106), wherein the outer surface (102, 103, 106) includes: a first capacitor major surface (102, 103); a second capacitor major surface (103, 102) opposite to the first capacitor major surface (102, 103) in a thickness direction of the capacitor body (104); and a capacitor lateral surface (106) between the first capacitor major surface (102) and the second capacitor major surface (103, 102); and a metal layer (171, 172, 304, 305) arranged on the outer surface (102, 103, 106) of the capacitor body (104), wherein: the capacitor body (104) includes a first layer section (107) and a second layer section (108, 109); the first layer section (107) includes a plurality of ceramic dielectric layers (105) and a plurality of internal electrodes (141, 142, 312, 313), wherein the ceramic dielectric layers (105) and the internal electrodes (141, 142, 312, 313) are layered alternately; the second layer section (108, 109) is exposed at the first capacitor major surface (102, 103), and includes a corner portion (154, 155, 302, 303) at a boundary between the first capacitor major surface (102, 103) and the capacitor lateral surface (106); and the metal layer (171, 172, 304, 305) covers the corner portion (154, 155, 302, 303) of the second layer section (108, 109).

The feature that the metal layer (171, 172, 304, 305) covers the corner portion (154, 155, 302, 303) of the second layer section (108, 109) that is relatively brittle, is effective for enhancing the toughness of the capacitor body. This serves to prevent the occurrence of cracks near the corner portion of the ceramic capacitor, even if an external stress is concentrated at the corner portion when the ceramic capacitor is installed inside the wiring board.

It is preferable that the size of the ceramic capacitor in the longitudinal direction is greater than or equal to 5 mm and less than or equal to 40 mm, because the first technical concept is more effective as follows. If the size of the ceramic capacitor in the longitudinal direction is greater than or equal to 5 mm, then the surface of the ceramic capacitor is subject to a large external stress, so that it is likely that a crack occurs near the corner portion of the ceramic capacitor, and thereby causes problems as described above. If the size of the ceramic capacitor in the longitudinal direction is less than 5 mm, the capacity of the ceramic capacitor tends to be insufficient. On the other hand, if the size of the ceramic capacitor in the longitudinal direction is greater than 40 mm, the wiring board must be enlarged for mounting the ceramic capacitor.

The first technical concept is more effective, if the metal layer (171, 172, 304, 305) includes an outer surface in contact with a resin insulator (92). Specifically, if the metal layer (171, 172, 304, 305) includes an outer surface in contact with a resin insulator (92), it is likely that an external stress is concentrated at the corner portion of the ceramic capacitor, thereby causing problems as described above.

It is preferable that the ceramic capacitor (101, 301, 301A, 301B, 311) further comprises: a plurality of in-capacitor via conductors (131, 132) electrically connected to the internal electrodes (141, 142, 312, 313); and a plurality of external electrodes (111, 112, 121, 122) electrically connected to end portions of the in-capacitor via conductors (131, 132) closer to the first capacitor major surface (102, 103). This feature is effective for ensuring that the ceramic capacitor is electrically connected to conductors of the wiring board. It is preferable that the ceramic capacitor is of a via array type in which a plurality of in-capacitor via conductors are arranged in an array. This feature is effective for reducing the inductance of the ceramic capacitor, and achieving high speed power supply for noise absorption and power fluctuation smoothing.

It is preferable that each ceramic dielectric layer is a sintered product of dielectric ceramics such as barium titanate, lead titanate, or strontium titanate. This feature makes it possible to easily prepare a ceramic capacitor having a large capacitance. Alternatively, each ceramic dielectric layer may be a sintered product of so-called high-temperature-sintered ceramics such as alumina, aluminum nitride, boron nitride, silicon carbonate, or silicon nitride, according to applications. Moreover, each ceramic dielectric layer may be a sintered product of so-called low-temperature-sintered ceramics such as glass ceramics which is produced by adding an inorganic ceramic filler such as alumina to borosilicate glass or borosilicate lead glass.

It is preferable that the thickness of each ceramic dielectric layer constituting the second layer section is greater than that of each ceramic dielectric layer constituting the first layer section. This feature is effective for enhancing the strength of the second layer section. Alternatively, the thickness of each ceramic dielectric layer constituting the second layer section may be however equal to that of each ceramic dielectric layer constituting the first layer section. This alternative feature is effective for reducing the manufacturing cost, because identical sheet materials can be used to form the ceramic dielectric layers of the first layer section and the ceramic dielectric layers of the second layer sections.

The internal electrodes, in-capacitor via conductors, and external electrodes may be made of any kind of conductive material basically. However, if these conductors and the ceramic dielectric layers are formed simultaneously by firing (co-firing process), it is preferable that metal powder in the conductors has a higher melting point than the firing temperature for the ceramic dielectric layers. For example, if the ceramic dielectric layer is made of high dielectric content ceramics such as barium titanate, then the conductors may be made of nickel (Ni), copper (Cu), silver (Ag), palladium (Pd), platinum (Pt), an alloy thereof, etc. If the ceramic dielectric layer is made of high-temperature-sintered ceramics such as alumina, then the conductors may be made from metal powder of tungsten (W), molybdenum (Mo), manganese (Mn), an alloy thereof, etc. If the ceramic dielectric layer is made of low-temperature-sintered ceramics such as glass ceramics, then the conductors may be made from metal powder of copper (Cu), silver (Ag), an alloy thereof, etc. The internal electrodes and external electrodes are formed by applying a conductor paste containing metal powder by a commonly-known process, for example, by printing, and then firing the paste. The in-capacitor via conductors are formed by setting by press-fitting, and then firing. Part of the external electrodes may be baked conductors. Specifically, the external electrode may be formed by applying the sintered capacity body (or the external electrode) with a conductor paste containing copper (Cu) or silver (Ag), and firing the paste under predetermined atmosphere.

The metal layer is arranged on the outer surface of the capacitor body, and covers at least the corner portion of the capacitor body. It is more preferable that the metal layer also covers the capacitor major surface and the capacitor lateral surface. This feature is effective for further enhancing the toughness of the capacitor body, and thereby preventing more reliably the occurrence of cracks close to the corner portion of the capacitor body.

It is preferable that the metal layer (171, 172, 304, 305) is arranged out of contact with at least part of the external electrodes (111, 112, 121, 122), and covers the first capacitor major surface (102, 103). This feature is effective for preventing failures such as short circuit due to electrical connection between the external electrodes, while enhancing the toughness of the capacity body.

The feature that the metal layer covers the capacitor lateral surface is specifically implemented, for example, by a construction that the metal layer (304, 305) includes a lateral surface cover portion (306, 307, 314, 315) covering an end portion of the capacitor lateral surface (106) closer to the first capacitor major surface (102, 103). It is preferable that size of the lateral surface cover portion (306, 307, 314, 315) of the metal layer (304, 305) is greater than or substantially equal to size of the second layer section (108, 109) in the thickness direction of the capacitor body (104). This feature is effective for reinforcing the second layer section whose toughness is relatively low if the second layer is composed only of the ceramic dielectric layers. Accordingly, this feature is effective for enhancing the toughness of the capacitor body, and thereby reliably preventing the occurrence of cracks close to the corner portion of the ceramic capacitor.

The toughness of the capacitor body tends to increase, as the size of the first lateral surface cover portion in the thickness direction of the capacitor body increases. However, in cases where the at least part of end surfaces of the internal electrodes (312, 313) is exposed at the capacitor lateral surface (106), it is preferable that the size of the lateral surface cover portion (306, 307, 314, 315) of the metal layer (304, 305) is substantially equal to the size of the second layer section (108, 109) in the thickness direction of the capacitor body (104). This feature is effective for preventing failures such as short circuit due to electrical connection between the external electrodes, while enhancing the toughness of the capacity body. In cases where the capacitor body (104) includes dummy electrodes (217) electrically insulated from the internal electrodes (312, 313), and at least part of end surfaces of the dummy electrodes (217) is exposed at the capacitor lateral surface (106), the size of the lateral surface cover portion (306, 307, 314, 315) of the metal layer (304, 305) may be set arbitrarily.

All or part of layers constituting the metal layer are made of a metal material such as copper, silver, iron, cobalt, or nickel. It is preferable that the surface of the metal layer is made of a highly conductive metal material such as copper or silver, especially in cases where the ceramic capacitor is mounted inside the wiring board.

It is preferable that at least part of the metal layer (171, 172, 304, 305) and the internal electrodes (141, 142, 312, 313) or external electrodes (111, 112, 121, 122) are made of an identical metal material. This feature eliminates the necessity of preparing a special metal material for the metal layer, and also makes it possible to form the metal layer and the external electrodes simultaneously by firing under the same conditions (temperature, time period). This leads to reduction in the manufacturing cost. The surface of the metal layer may be plated with copper or gold.

It is preferable that the metal layer (171, 172, 304, 305) has a greater thickness than the internal electrodes (141, 142, 312, 313), specifically the metal layer (171, 172, 304, 305) has a thickness greater than or equal to 5 micrometers and less than or equal to 40 or 50 micrometers. If the thickness of the metal layer is less than 5 micrometers, it is possible that the entire surface of the capacitor body fails to be suitably covered, and the strength of the capacitor body becomes insufficient, so that a crack occurs in the capacity body. On the other hand, if the thickness of the metal layer is greater than 50 micrometers, part of the metal layer tends to be out of contact with the capacitor body, especially with the capacitor lateral surface, so that the corner portion of ceramics is exposed, and a crack occurs at the corner portion.

It is preferable that the metal layer (171, 172, 304, 305) includes a curved outer surface (308, 309) at the corner portion (154, 155, 302, 303) of the second layer section (108, 109). This feature is effective for suppressing stress concentration at the metal layer, even if a resin insulator is subject to thermal stress when the ceramic capacitor is mounted under condition that the outer surface of the ceramic capacitor is in contact with the resin insulator. The feature that the outer surface of the metal layer is formed with no angled corner is effective for further suppressing stress concentration. This makes it possible to reliably prevent the occurrence of cracks in the resin insulator.

It is preferable that the capacitor body (104) is formed with a chamfer (162, 163) at the boundary between the first capacitor major surface (102, 103) and the capacitor lateral surface (106), and the chamfer (162, 163) is covered by the metal layer (171, 172). This feature is effective for suppressing stress concentration at the boundary between the first capacitor major surface (102, 103) and the capacitor lateral surface (106), even if a resin insulator is subject to thermal stress when the ceramic capacitor is mounted under condition that the outer surface of the ceramic capacitor is in contact with the resin insulator. This makes it possible to reliably prevent the occurrence of cracks in the resin insulator.

It is preferable that the capacitor body (104) includes a lateral chamfer (161) at a boundary between the capacitor lateral surface as a first capacitor lateral surface (106) and a second capacitor lateral surface (106) adjacent to the first capacitor lateral surface (106). This feature is effective for suppressing stress concentration at the boundary between the two adjacent capacitor lateral surfaces, even if a resin insulator is subject to thermal stress when the ceramic capacitor is mounted under condition that the outer surface of the ceramic capacitor is in contact with the resin insulator. This makes it possible to reliably prevent the occurrence of cracks in the resin insulator.

In view of suppression of stress concentration, it is preferable that the chamfers and lateral chamfers have curved surfaces, although the chamfers and lateral chamfers may have flat surfaces. The flat chamfers are advantageous in formation, because the flat shapes can be easily and accurately formed, as compared to the curved chamfers.

It is preferable that if the chamfer (162, 163) is substantially flat, the chamfer (162, 163) has a chamfer depth ($C2$; $C3$) with respect to the first capacitor major surface (102, 103) which is less than half of size of the capacitor body (104) in the thickness direction. If the chamfer (162, 163) has a chamfer depth ($C2$; $C3$) with respect to the first capacitor major surface (102, 103) which is greater than or equal to half of size of the capacitor body (104) in the thickness direction, it is possible that the chamfer formed at the periphery of the first capacitor major surface is continuous with the chamfer formed at the periphery of the second capacitor major surface, and the connection portion therebetween has an acute angle. This may cause stress concentration at the connection portion between two adjacent chamfers, and thereby cause a crack in the resin insulator in contact with the outer surface.

It is preferable that the chamfer (162, 163) under the metal layer (171, 172) has a greater surface roughness (Ra) than the capacitor major surface (102, 103) under the metal layer (171, 172). This feature is effective for enhancing the contact between the metal layer and the chamfer of the ceramic dielectric layer, because microscopic asperities serve for anchoring. Accordingly, this feature is effective for preventing the occurrence of cracks. For example, it is preferable that the surface roughness (Ra) of the chamfer under the metal layer is set to from 0.5 µm to 3.0 µm, and the surface roughness (Ra) of the capacitor major surface under the metal layer is set from 0.2 µm to 0.3 µm. If the chamfers are formed by laser processing to a ceramic dielectric product before sintered, it is possible to easily set the roughness of the chamfer under the metal layer greater than that of the capacitor major surface.

According to a second technical concept, a wiring board (10) comprises a portion (91a) inside which the ceramic capacitor (301, 301A, 301B, 311) according to the first technical concept is mounted.

The feature that the metal layer (171, 172, 304, 305) covers the corner portion (154, 155, 302, 303) of the second layer section (108, 109) that is relatively brittle, is effective for enhancing the toughness of the capacitor body. This serves to prevent the occurrence of cracks near the corner portion of the ceramic capacitor, even if an external stress is concentrated at the corner portion when the ceramic capacitor is installed inside the wiring board. As a result, the reliability of the wiring board is enhanced.

It is preferable that the wiring board includes a core board including an accommodation hole for accommodating the ceramic capacitor according to the first technical concept, and wiring layer sections formed on the core major surface 12 and core back surface 13 of the core board 11. The core board may be made of an arbitrary material, but it is preferable that the core board is made mainly of a high polymer material. The high polymer material is, for example, EP resin (epoxy resin), PI resin (polyimide resin), BT resin (bismaleimide-triazine resin), or PPE resin (polyphenyl ether resin). Alternatively, the core board may be composed of a composite material of such a resin and glass fiber (glass woven fabric or glass nonwoven fabric) or organic fiber such as polyamide fiber.

According to a third technical concept, a wiring board (341, 343) comprises a board major surface (342, 344) on which the ceramic capacitor (101) according to according to the first technical concept is mounted by flip chip mounting.

The feature that the metal layer (171, 172, 304, 305) covers the corner portion (154, 155, 302, 303) of the second layer section (108, 109) that is relatively brittle, is effective for enhancing the toughness of the capacitor body. This serves to prevent the occurrence of cracks near the corner portion of the ceramic capacitor, even if an external stress is concentrated at the corner portion when the ceramic capacitor is on the surface of the wiring board. As a result, the reliability of the wiring board is enhanced.

In the wiring board, the space between the core major surface and the ceramic capacitor may be sealed by a resin material. Even when the ceramic capacitor is subject to a tension stress due to thermal hardening and shrinkage during sealing operation with the resin material, this feature is effective for preventing the occurrence of cracks at the periphery of the ceramic capacitor.

The entire contents of Japanese Patent Application 2009-132289 filed Jun. 1, 2009 are incorporated herein by reference.

Although the invention has been described above by reference to certain embodiments of the invention, the invention is not limited to the embodiments described above. Modifications and variations of the embodiments described above will occur to those skilled in the art in light of the above teachings. The scope of the invention is defined with reference to the following claims.

What is claimed is:

1. A ceramic capacitor comprising:
  a capacitor body including an outer surface, wherein the outer surface includes:
    a first capacitor major surface;
    a second capacitor major surface opposite to the first capacitor major surface in a thickness direction of the capacitor body; and
    a capacitor lateral surface between the first capacitor major surface and the second capacitor major surface; and
  a metal layer arranged on the outer surface of the capacitor body, wherein:
  the capacitor body includes a first layer section and a second layer section;
  the first layer section includes a plurality of ceramic dielectric layers and a plurality of internal electrodes, wherein the ceramic dielectric layers and the internal electrodes are layered alternately;
  the second layer section is exposed at the first capacitor major surface, and includes a corner portion at a boundary between the first capacitor major surface and the capacitor lateral surface;
  the metal layer covers the corner portion of the second layer section;
  the metal layer includes a lateral surface cover portion covering an end portion of the capacitor lateral surface closer to the first capacitor major surface;
  size of the lateral surface cover portion of the metal layer is substantially equal to size of the second layer section in the thickness direction of the capacitor body; and
  the first layer section includes a lateral surface exposed at the capacitor lateral surface.

2. The ceramic capacitor as claimed in claim 1, further comprising:
  a plurality of in-capacitor via conductors electrically connected to the internal electrodes; and
  a plurality of external electrodes electrically connected to end portions of the in-capacitor via conductors closer to the first capacitor major surface,
  wherein the metal layer is arranged out of contact with at least part of the external electrodes, and covers the first capacitor major surface.

3. The ceramic capacitor as claimed in claim 1, wherein at least part of end surfaces of the internal electrodes is exposed at the capacitor lateral surface.

4. The ceramic capacitor as claimed in claim 1, wherein:
  the capacitor body includes dummy electrodes electrically insulated from the internal electrodes; and
  at least part of end surfaces of the dummy electrodes is exposed at the capacitor lateral surface.

5. The ceramic capacitor as claimed in claim 1, wherein:

the capacitor body is formed with a chamfer at the boundary between the first capacitor major surface and the capacitor lateral surface; and
the chamfer is covered by the metal layer.

6. The ceramic capacitor as claimed in claim 5, wherein:
the chamfer is substantially flat; and
the chamfer has a chamfer depth with respect to the first capacitor major surface which is less than half of size of the capacitor body in the thickness direction.

7. The ceramic capacitor as claimed in claim 1, wherein the metal layer includes a curved outer surface at the corner portion of the second layer section.

8. The ceramic capacitor as claimed in claim 1, wherein the metal layer includes an outer surface in contact with a resin insulator.

9. The ceramic capacitor as claimed in claim 1, wherein the first capacitor major surface and the capacitor lateral surface meet one another at a right angle at the boundary where the corner portion of the second layer section is located.

10. The ceramic capacitor as claimed in claim 1, wherein the capacitor body includes:
a lateral chamfer at a boundary between the capacitor lateral surface as a first capacitor lateral surface and a second capacitor lateral surface adjacent to the first capacitor lateral surface; and
a chamfer at a boundary between the first capacitor major surface and a set of the lateral chamfer, the first capacitor lateral surface, and the second capacitor lateral surface.

11. The ceramic capacitor as claimed in claim 1, wherein the metal layer has a greater thickness than the internal electrodes.

12. The ceramic capacitor as claimed in claim 1, wherein the metal layer has a thickness greater than or equal to 5 micrometers and less than or equal to 40 micrometers.

13. The ceramic capacitor as claimed in claim 1, wherein at least part of the metal layer and the internal electrodes are made of an identical material.

14. A wiring board comprising a portion inside which the ceramic capacitor as claimed in claim 1 is mounted.

15. A wiring board comprising a board major surface on which the ceramic capacitor as claimed in claim 1 is mounted by flip chip mounting.

16. A ceramic capacitor comprising:
a capacitor body including an outer surface, wherein the outer surface includes:
a first capacitor major surface;
a second capacitor major surface opposite to the first capacitor major surface in a thickness direction of the capacitor body; and
a capacitor lateral surface between the first capacitor major surface and the second capacitor major surface; and
a metal layer arranged on the outer surface of the capacitor body,
wherein:
the capacitor body includes a first layer section and a second layer section;
the first layer section includes a plurality of ceramic dielectric layers and a plurality of internal electrodes, wherein the ceramic dielectric layers and the internal electrodes are layered alternately;
the second layer section is exposed at the first capacitor major surface, and includes a corner portion at a boundary between the first capacitor major surface and the capacitor lateral surface;
the metal layer covers the corner portion of the second layer section;

the capacitor body is formed with a chamfer at the boundary between the first capacitor major surface and the capacitor lateral surface;
the chamfer is covered by the metal layer; and
the chamfer under the metal layer has a greater surface roughness than the first capacitor major surface under the metal layer.

17. The ceramic capacitor as claimed in claim 16, further comprising:
a plurality of in-capacitor via conductors electrically connected to the internal electrodes; and
a plurality of external electrodes electrically connected to end portions of the in-capacitor via conductors closer to the first capacitor major surface,
wherein the metal layer is arranged out of contact with at least part of the external electrodes, and covers the first capacitor major surface.

18. The ceramic capacitor as claimed in claim 16, wherein the metal layer includes a lateral surface cover portion covering an end portion of the capacitor lateral surface closer to the first capacitor major surface.

19. The ceramic capacitor as claimed in claim 18, wherein size of the lateral surface cover portion of the metal layer is greater than or substantially equal to size of the second layer section in the thickness direction of the capacitor body.

20. The ceramic capacitor as claimed in claim 19, wherein:
at least part of end surfaces of the internal electrodes is exposed at the capacitor lateral surface; and
the size of the lateral surface cover portion of the metal layer is substantially equal to the size of the second layer section in the thickness direction of the capacitor body.

21. The ceramic capacitor as claimed in claim 19, wherein:
the capacitor body includes dummy electrodes electrically insulated from the internal electrodes; and
at least part of end surfaces of the dummy electrodes is exposed at the capacitor lateral surface.

22. The ceramic capacitor as claimed in claim 16, wherein:
the chamfer is substantially flat; and
the chamfer has a chamfer depth with respect to the first capacitor major surface which is less than half of size of the capacitor body in the thickness direction.

23. The ceramic capacitor as claimed in claim 16, wherein the metal layer includes a curved outer surface at the corner portion of the second layer section.

24. The ceramic capacitor as claimed in claim 16, wherein the metal layer includes an outer surface in contact with a resin insulator.

25. The ceramic capacitor as claimed in claim 16, wherein the first capacitor major surface and the capacitor lateral surface meet one another at a right angle at the boundary where the corner portion of the second layer section is located.

26. The ceramic capacitor as claimed in claim 16, wherein the capacitor body includes:
a lateral chamfer at a boundary between the capacitor lateral surface as a first capacitor lateral surface and a second capacitor lateral surface adjacent to the first capacitor lateral surface; and
a chamfer at a boundary between the first capacitor major surface and a set of the lateral chamfer, the first capacitor lateral surface, and the second capacitor lateral surface.

27. The ceramic capacitor as claimed in claim 16, wherein the metal layer has a greater thickness than the internal electrodes.

28. The ceramic capacitor as claimed in claim 16, wherein the metal layer has a thickness greater than or equal to 5 micrometers and less than or equal to 40 micrometers.

29. The ceramic capacitor as claimed in claim 16, wherein at least part of the metal layer and the internal electrodes are made of an identical material.

30. A wiring board comprising a portion inside which the ceramic capacitor as claimed in claim 16 is mounted.

31. A wiring board comprising a board major surface on which the ceramic capacitor as claimed in claim 16 is mounted by flip chip mounting.

* * * * *